United States Patent
Kotake et al.

(10) Patent No.: US 10,790,465 B2
(45) Date of Patent: Sep. 29, 2020

(54) WHITE ORGANIC EL ELEMENT

(71) Applicant: CANON KABUSHIKI KAISHA, Tokyo (JP)

(72) Inventors: Tomokazu Kotake, Ebina (JP); Hirokazu Miyashita, Ebina (JP); Itaru Takaya, Atsugi (JP); Takayuki Ito, Kawasaki (JP); Koji Ishizuya, Fujisawa (JP); Norifumi Kajimoto, Zama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/523,798

(22) Filed: Jul. 26, 2019

(65) Prior Publication Data
US 2020/0044175 A1     Feb. 6, 2020

(30) Foreign Application Priority Data

Aug. 2, 2018  (JP) ................................. 2018-145705

(51) Int. Cl.
*H01L 51/50* (2006.01)
*H01L 27/32* (2006.01)
*H01L 51/52* (2006.01)

(52) U.S. Cl.
CPC .......... *H01L 51/504* (2013.01); *H01L 27/322* (2013.01); *H01L 27/3213* (2013.01);
(Continued)

(58) Field of Classification Search
CPC ............... H01L 51/504; H01L 51/5056; H01L 51/5092; H01L 51/5096; H01L 51/5072;
(Continued)

(56) References Cited

U.S. PATENT DOCUMENTS 7,683,536 B2 * 3/2010 Forrest ................ H01L 51/5016
313/506
8,853,715 B2 * 10/2014 Matsuda ............... H01L 51/504
257/102
(Continued)

FOREIGN PATENT DOCUMENTS

JP     2012-204793 A     10/2012
JP     2016-111134 A     6/2016

OTHER PUBLICATIONS

Hany Aziz, et al., "Degradation Mechanism of Small Molecule-Based Organic Light-Emitting Devices", Science, vol. 283, pp. 900-1902 (Mar. 19, 1999).

*Primary Examiner* — Michael M Trinh
(74) *Attorney, Agent, or Firm* — Canon U.S.A., Inc. IP Division

(57) ABSTRACT

A white organic electroluminescent (EL) element includes, in sequence, an anode, a first light-emitting layer that is a blue-light-emitting layer, a hole-blocking layer, an electron transport layer, and a cathode. The hole-blocking layer is adjacent to the first light-emitting layer and the electron transport layer and formed of a hydrocarbon. The electron transport layer is formed of a nitrogen-containing heterocyclic compound. The first light-emitting layer contains a first host and a first dopant that emits blue fluorescent light. Relations (a), (b), and (c) are satisfied.

$$\text{LUMO}(H1) > \text{LUMO}(D1) \quad (a)$$

$$0.1 < d(\text{ETL})/d(\text{HBL}) < 0.7 \quad (b)$$

$$90 \text{ nm} \leq d(E) = d(\text{HBL}) + d(\text{ETL}) < 150 \text{ nm} \quad (c)$$

LUMO (H1): lowest unoccupied molecular orbital (LUMO) energy of first host
LUMO (D1): LUMO energy of first dopant
(Continued)

d (HBL): thickness of hole-blocking layer
d (ETL): thickness of electron transport layer.

15 Claims, 9 Drawing Sheets

(52) U.S. Cl.
CPC ...... *H01L 51/5004* (2013.01); *H01L 51/5024* (2013.01); *H01L 51/5056* (2013.01); *H01L 51/5072* (2013.01); *H01L 51/5092* (2013.01); *H01L 51/5096* (2013.01); *H01L 51/5206* (2013.01); *H01L 51/5221* (2013.01)

(58) Field of Classification Search
CPC . H01L 51/00; H01L 51/5221; H01L 51/5206; H01L 51/5012; H01L 51/5036; H01L 51/5024; H01L 51/5084; H01L 51/5076; H01L 51/5004; H01L 2251/558; H01L 27/3244; H01L 27/3213; H01L 27/322
See application file for complete search history.

(56) References Cited

U.S. PATENT DOCUMENTS

| | | | |
|---|---|---|---|
| 8,860,013 B2* | 10/2014 | Okamoto | H01L 51/5004 257/40 |
| 8,927,974 B2* | 1/2015 | Takaya | H01L 51/504 257/40 |
| 2011/0108810 A1* | 5/2011 | Kishino | H05B 33/14 257/40 |
| 2011/0175071 A1* | 7/2011 | Masui | H01L 51/5016 257/40 |

* cited by examiner

WHITE ORGANIC EL ELEMENT

BACKGROUND

Field of the Disclosure

The present disclosure relates to a white organic EL element.

Description of the Related Art

In recent years, full-color light-emitting arrays including organic electroluminescent (EL) elements have been intensively studied and developed. Full-color light-emitting arrays are produced by the following two methods. In one method, different light-emitting layers are allocated to pixels (elements). In the other method, a white organic EL element including a white-light-emitting layer and different color filters allocated to pixels is used. For such a white organic EL element, two or more luminescent materials are often used.

Japanese Patent Laid-Open No. 2016-111134 (hereinafter referred to as Patent Literature 1) discloses a white organic EL element having a tandem structure and including an electron supply layer that is thick so that current leakage is reduced and light emission efficiency is improved.

Japanese Patent Laid-Open No. 2012-204793 (hereinafter referred to as Patent Literature 2) discloses a white organic EL element including an electron supply layer that contains a nitrogen-containing heterocyclic compound and is thick so that carrier balance is adjusted.

However, the white organic EL element disclosed in Patent Literature 1 has a high drive voltage for its tandem structure including a charge generation layer. Moreover, the electron supply layer is thick in order to reduce current leakage from the charge generation layer. This increases the thickness of the entire element and results in a higher voltage.

The white organic EL element disclosed in Patent Literature 2 has insufficient durability. In the white organic EL element in Patent Literature 2, the electron supply layer adjacent to a light-emitting layer contains a nitrogen-containing heterocyclic compound. Nitrogen-containing heterocyclic compounds tend to be unstable and deteriorated upon receiving holes. Thus, the use of the nitrogen-containing heterocyclic compound in the electron supply layer adjacent to a light-emitting layer may reduce the durability of the organic EL element. Furthermore, the luminescent material for the light-emitting layer adjacent to the electron supply layer is an amine compound. Thus, the light-emitting layer has hole-trapping properties, which tends to cause an interaction between holes and the nitrogen-containing heterocyclic compound forming a hole-blocking layer and may degrade element performance.

SUMMARY

The present disclosure has been made to solve the disadvantages described above and provides a white organic EL element having improved voltage properties and durability.

A white organic EL element according to an aspect of the present disclosure includes, in sequence, an anode, a first light-emitting layer that is a blue-light-emitting layer, a hole-blocking layer, an electron transport layer, and a cathode. The hole-blocking layer is adjacent to the first light-emitting layer and the electron transport layer. The first light-emitting layer contains a first host and a first dopant that emits blue fluorescent light. The hole-blocking layer is formed of a hydrocarbon. The electron transport layer is formed of a nitrogen-containing heterocyclic compound. The first host and the first dopant satisfy relation (a): (a) LUMO (H1)>LUMO (D1). The hole-blocking layer and the electron transport layer satisfy relation (b) and relation (c): (b) 0.1<d (ETL)/d (HBL)<0.7, (c) 90 nm≤d (E)=d (HBL)+d (ETL)<150 nm. In the relations, LUMO (H1) is a lowest unoccupied molecular orbital (LUMO) energy of the first host, LUMO (D1) is a LUMO energy of the first dopant, d (HBL) is a thickness of the hole-blocking layer, d (ETL) is a thickness of the electron transport layer, and d (E) is a total thickness of an electron supply layer composed of the hole-blocking layer and the electron transport layer.

Further features of the present disclosure will become apparent from the following description of exemplary embodiments with reference to the attached drawings.

DESCRIPTION OF THE EMBODIMENTS

White Organic EL Element

A white organic EL element of the present disclosure includes, in sequence, an anode, a first light-emitting layer that is a blue-light-emitting layer, a hole-blocking layer, an electron transport layer, and a cathode, and the hole-blocking layer is adjacent to the first light-emitting layer and the electron transport layer. The first light-emitting layer contains a first host and a first dopant that emits blue fluorescent light, and the lowest unoccupied molecular orbital (LUMO) energy of the first host is higher than the LUMO energy of the first dopant (closer to the vacuum level). The hole-blocking layer has a particular thickness larger than the thickness of the electron transport layer.

The white organic EL element of the present disclosure is a white-light-emitting organic EL element that emits light when a current is applied to an organic compound layer sandwiched between a pair of electrodes and including a light-emitting layer.

Figure 1B:
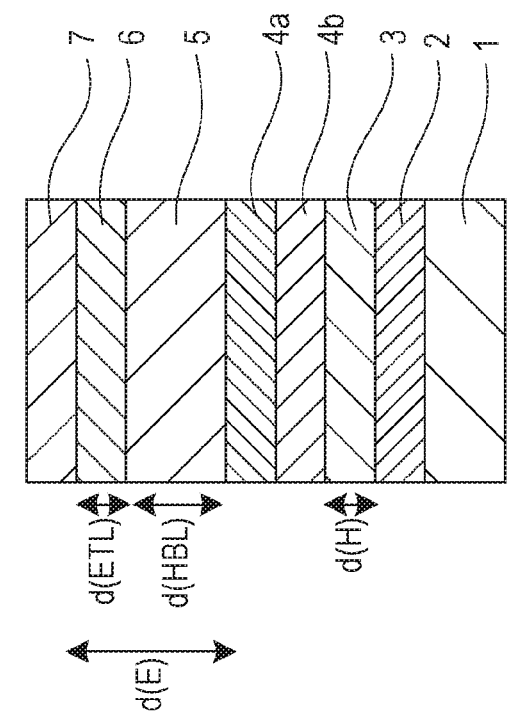
FIGS. 1A and 1B are schematic sectional views illustrating white organic EL elements according to embodiments of the present disclosure.
Figure 1A:
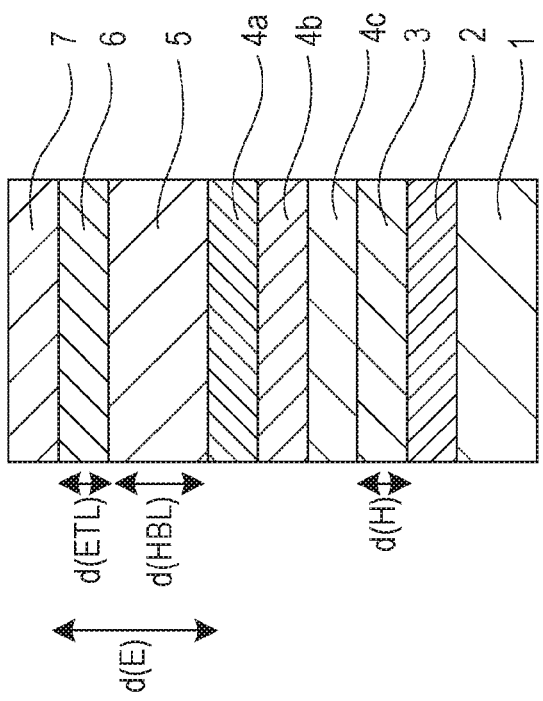

The present disclosure will hereinafter be described in more detail with reference to FIGS. 1A and 1B. FIGS. 1A and 1B are schematic sectional views illustrating white organic EL elements according to embodiments of the present disclosure.

The white organic EL element illustrated in FIG. 1A includes a substrate 1, an anode 2, a hole transport layer 3, a third light-emitting layer 4c, a second light-emitting layer 4b, a first light-emitting layer 4a, a hole-blocking layer 5, an electron transport layer 6, and a cathode 7 stacked in this order. The first light-emitting layer 4a is a blue-fluorescent-light-emitting layer, and the second light-emitting layer 4b and the third light-emitting layer 4c contain fluorescent dopants of different emission colors and constitute either a green-light-emitting layer or a red-light-emitting layer.

The white organic EL element illustrated in FIG. 1B includes a substrate 1, an anode 2, a hole transport layer 3, a second light-emitting layer 4b, a first light-emitting layer 4a, a hole-blocking layer 5, an electron transport layer 6, and a cathode 7 stacked in this order. The first light-emitting layer 4a is a blue-fluorescent-light-emitting layer, and the second light-emitting layer 4b contains two fluorescent dopants of different emission colors and is a green- and red-light-emitting layer.

The light-emitting layers (4a, 4b, 4c) each contains a host and a dopant. Specifically, the first light-emitting layer 4a contains a first host and a first dopant, and the second light-emitting layer 4b contains a second host and a second dopant. When the third light-emitting layer 4c is included, the third light-emitting layer contains a third host and a third dopant. When the third light-emitting layer 4c is not included, the third dopant is contained in the second light-emitting layer 4b. The first dopant is a blue dopant, and the second dopant and the third dopant are either a green dopant or a red dopant, each being a fluorescent dopant.

In the present disclosure, a light-emitting layer is an organic compound layer disposed between electrodes and has a light-emitting function. A host contained in a light-emitting layer is a material that is the main component of the light-emitting layer. More specifically, a host is a material contained in an amount of 50 mass % or more in a light-emitting layer. A dopant is a material that is not the main component of a light-emitting layer. More specifically, a dopant is a material contained in an amount of less than 50 mass % in a light-emitting layer.

The white organic EL elements illustrated in FIGS. 1A and 1B may each further include a hole injection layer between the anode 2 and the hole transport layer 3 and an electron-blocking layer between the hole transport layer 3 and its adjacent light-emitting layer. The white organic EL elements may each further include an electron injection layer between the electron transport layer 6 and the cathode 7. The hole injection layer, the electron-blocking layer, and the electron injection layer may optionally be used.

Figure 2:
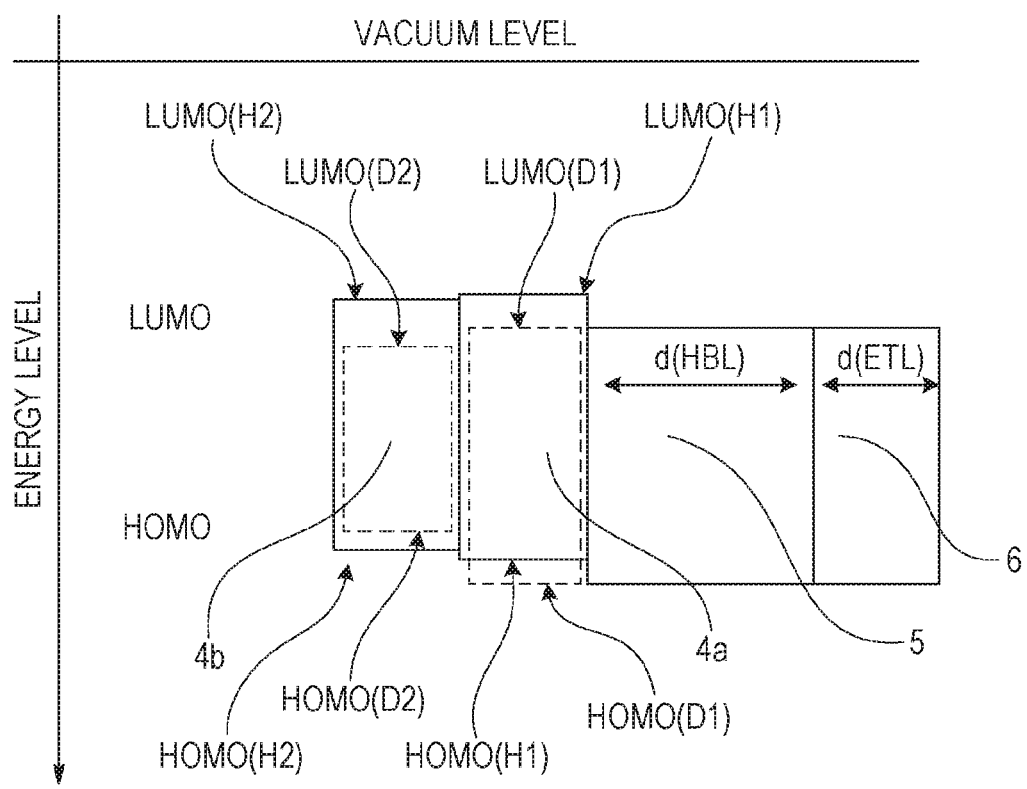
FIG. 2 is an energy diagram schematically illustrating energy levels of layers constituting the white organic EL element of the present disclosure.

FIG. 2 is an energy diagram schematically illustrating energy levels of light-emitting layers and layers nearby constituting the organic EL element of the present disclosure. As illustrated in FIG. 2, in the present disclosure, the first host and the first dopant contained in the first light-emitting layer 4a satisfy relation (a).

$$\text{LUMO}(H1) > \text{LUMO}(D1) \qquad (a)$$

LUMO (H1): LUMO energy of first host
LUMO (D1): LUMO energy of first dopant

The hole-blocking layer 5 and the electron transport layer 6 satisfy relation (b) and relation (c).

$$0.1 < d(\text{ETL})/d(\text{HBL}) < 0.7, \text{ preferably } 0.2 \leq d(\text{ETL})/d(\text{HBL}) < 0.5 \qquad (b)$$

$$90 \text{ nm} \leq d(E) = d(\text{HBL}) + d(\text{ETL}) < 150 \text{ nm, preferably } 100 \text{ nm} \leq d(E) = d(\text{HBL}) + d(\text{ETL}) \leq 130 \text{ nm} \qquad (c)$$

d (HBL): thickness of hole-blocking layer 5
d (ETL): thickness of electron transport layer 6
d (E): total thickness of electron supply layer composed of hole-blocking layer 5 and electron transport layer 6

Values of HOMO energy and LUMO energy are calculated with respect to the vacuum level and are negative in the case of typical molecules. In this specification, when values of HOMO energy and LUMO energy are compared, small values (i.e., large absolute values in the case of negative values) may be expressed as "deep", and large values (i.e., small absolute values in the case of negative values) as "shallow".

In the present disclosure, values of HOMO energy and LUMO energy are determined by molecular orbital calculation. The molecular orbital calculation is performed by density functional theory (DFT), which is now widely used. The B3LYP functional and the 6-31G* basis function are used. The molecular orbital calculation is performed by Gaussian 09 (Gaussian 09, Revision C.01, M. J. Frisch, G. W. Trucks, H. B. Schlegel, G. E. Scuseria, M. A. Robb, J. R. Cheeseman, G. Scalmani, V. Barone, B. Mennucci, G. A. Petersson, H. Nakatsuji, M. Caricato, X. Li, H. P. Hratchian, A. F. Izmaylov, J. Bloino, G. Zheng, J. L. Sonnenberg, M. Hada, M. Ehara, K. Toyota, R. Fukuda, J. Hasegawa, M. Ishida, T. Nakajima, Y. Honda, O. Kitao, H. Nakai, T. Vreven, J. A. Montgomery Jr., J. E. Peralta, F. Ogliaro, M. Bearpark, J. J. Heyd, E. Brothers, K. N. Kudin, V. N. Staroverov, T. Keith, R. Kobayashi, J. Normand, K. Raghavachari, A. Rendell, J. C. Burant, S. S. Iyengar, J. Tomasi, M. Cossi, N. Rega, J. M. Millam, M. Klene, J. E. Knox, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, R. L. Martin, K. Morokuma, V. G. Zakrzewski, G. A. Voth, P. Salvador, J. J. Dannenberg, S. Dapprich, A. D. Daniels, O. Farkas, J. B. Foresman, J. V. Ortiz, J. Cioslowski, and D. J. Fox, Gaussian, Inc., Wallingford Conn., 2010), which is now widely used.

In EXAMPLES described below, calculated values obtained by the molecular orbital calculation are compared with measured values to verify the accuracy of the calculated values.

The white organic EL elements illustrated in FIGS. 1A and 1B each has an element structure which includes two or more light-emitting layers and in which the hole-blocking layer 5 and the electron transport layer 6 are stacked in this order on the light-emitting layer on the cathode 7 side. Having the following features (1) to (5), the white organic EL elements have high durability and low drive voltages.

(1) A layer adjacent to the hole-blocking layer 5 is a light-emitting layer having electron-trapping properties.

Charges (holes and electrons) in a light-emitting layer move in the light-emitting layer back and forth between levels of a host and a dopant. In other words, charges in a light-emitting layer move in the light-emitting layer while being repeatedly trapped by or detrapped from a host or a dopant. The greater the difference in HOMO or LUMO energy between the host and the dopant, the lower the mobility of the charges. More specifically, when the LUMO energy of the host is lower than the LUMO energy of the dopant (far from the vacuum level), the light-emitting layer has electron-trapping properties, and the electron-trapping properties improve as the LUMO energy of the dopant decreases. When the HOMO energy of the dopant is higher than the HOMO energy of the host (closer to the vacuum level), the light-emitting layer has hole-trapping properties.

In the present disclosure, relation (a) is satisfied. That is, the first light-emitting layer 4a on the hole-blocking layer 5 side serves as a light-emitting layer having electron-trapping properties, and the electron mobility in the light-emitting layer is low. This causes electrons injected from the hole-blocking layer 5 into the first light-emitting layer 4a to be trapped, and recombination regions will be localized on the hole-blocking layer 5 side.

In general, an amine compound used as a material for the hole transport layer 3 has an unshared electron pair (a lone pair) and thus is unstable when transformed into the radical anion state by accepting an electron while being stable when transformed into the radical cation state by releasing an electron. That is, when an electron reaches the hole transport layer 3, the electron and the amine compound constituting the hole transport layer 3 interact with each other to cause material deterioration, which will probably result in reduction in light emission efficiency and durability. Since the first light-emitting layer 4a in the present disclosure has electron-trapping properties, recombination regions are localized on the hole-blocking layer 5 side. As a result, when a hole transport layer containing a compound having an unshared electron pair (a lone pair), such as an amine compound, is included, deterioration of the hole transport layer 3 due to electrons can be prevented, resulting in an organic EL element having high durability.

(2) A layer adjacent to the hole-blocking layer 5 is a blue-light-emitting layer.

In the case of a white organic EL element including a stack of a plurality of light-emitting layers, when recombination regions are localized on the hole-blocking layer 5 side as described above, only the light-emitting layer on the hole-blocking layer 5 side may emit light, making it difficult to provide white-light emission.

In the present disclosure, it has been discovered that the light-emitting layer on the hole-blocking layer 5 side needs to be a blue-light-emitting layer. By localizing recombination regions on the hole-blocking layer 5 side, that is, localizing recombination regions in the blue-light-emitting layer, excitons generated can be redistributed in the light-emitting layer located on the hole transport layer 3 side to provide white-light emission. That is, it has been discovered that a layer structure that allows the excitation energy of a blue dopant having a wide band gap to transfer to a red dopant and a green dopant enables all the dopants to emit light, thus providing white-light emission.

By contrast, when the light-emitting layer adjacent to the hole-blocking layer 5 is not a blue-light-emitting layer but, for example, a red-light-emitting layer, the excitation energy generated in the red-light-emitting layer can hardly transfer to blue and green dopants, and thus white-light emission cannot be provided.

(3) The hole-blocking layer 5 is formed of a hydrocarbon.

In addition, in the present disclosure, it has been discovered that the hole-blocking layer 5 needs to be formed of a hydrocarbon. The role of the hole-blocking layer 5 in the present disclosure is to inject and transport electrons to the first light-emitting layer 4a and to inhibit holes from reaching the electron transport layer 6 formed of a nitrogen-containing heterocyclic compound. Thus, it is required to accumulate holes at the interface between the first light-emitting layer 4a and the hole-blocking layer 5. That is, it has been discovered that the hole-blocking layer 5 needs to have a molecular structure resistant to excessively generated radical cations and may be made of a hydrocarbon with high chemical stability.

In general, compounds having a heteroatom such as a nitrogen atom, an oxygen atom, or a sulfur atom have an unshared electron pair and thus are active against donation and acceptance of electrons, that is, oxidation and reduction. Thus, such a compound has low chemical stability because unpaired electrons generated through donation and acceptance of electrons may cause an interaction, such as a disproportionation, that can lead to material deterioration. By contrast, hydrocarbons have no unshared electron pairs and have high chemical stability, and thus are suitable for use as materials for the hole-blocking layer 5.

In addition, since the adjacent light-emitting layer is a blue-light-emitting layer, a high excitation energy is generated. Thus, the hole-blocking layer 5 may have a molecular structure that does not allow the excitation energy to cause material deterioration. Specifically, a compound that has a high binding energy, that is, a strong bond may be used. Also in terms of binding stability, hydrocarbons are suitable for use as materials for the hole-blocking layer 5. The binding energy of hydrocarbons will be described below.

Furthermore, the hole-blocking layer 5 serves not only to adjust carrier balance but also to inhibit energy transfer from the first light-emitting layer 4a to the electron transport layer 6. Since the white organic EL element of the present disclosure is an EL element including fluorescent dopants, the compound constituting the hole-blocking layer 5 may be a compound having a sufficiently high S1 energy. Specifically, an aromatic hydrocarbon having a molecular structure constituted by an aromatic hydrocarbon ring selected from a benzene ring, a naphthalene ring, a fluorene ring, a benzofluorene ring, a phenanthrene ring, an anthracene ring, a chrysene ring, a triphenylene ring, a pyrene ring, a fluoranthene ring, and a benzofluoranthene ring may be used. The aromatic hydrocarbon may have an alkyl group having 1 to 12 carbon atoms.

An aromatic hydrocarbon having a molecular structure constituted by an aromatic hydrocarbon ring selected from a benzene ring, a naphthalene ring, a fluorene ring, a benzofluorene ring, a phenanthrene ring, a chrysene ring, a triphenylene ring, a pyrene ring, a fluoranthene ring, and a benzofluoranthene ring, excluding acene rings such as an anthracene ring, is more preferred. This is because an acene ring formed of linearly fused benzene rings has a substitution site with a high electron density in the central benzene ring, and thus is prone to oxidation and chemically unstable among aromatic hydrocarbons.

Furthermore, to sufficiently confine excitation energy in the light-emitting layer, a compound also having a sufficiently high T1 energy may be used. Specifically, an aromatic hydrocarbon having a molecular structure constituted by an aromatic hydrocarbon ring selected from a benzene ring, a naphthalene ring, a fluorene ring, a benzofluorene ring, a phenanthrene ring, a chrysene ring, a triphenylene ring, and a fluoranthene ring may be used.

On the other hand, a compound having, as a part of its molecular structure, at least an aromatic hydrocarbon ring selected from a fluorene ring, a benzofluorene ring, a phenanthrene ring, a chrysene ring, a triphenylene ring, and a fluoranthene ring may be used. A compound consisting solely of a benzene ring and a naphthalene ring has a wide band gap and may cause a barrier against electron injection from the electron transport layer 6 into the hole-blocking layer 5. This can make it difficult to adjust carrier balance or can cause electric field concentration in one area, leading to material deterioration.

(4) The electron transport layer 6 is formed of a nitrogen-containing heterocyclic compound.

The electron transport layer 6 is formed of a nitrogen-containing heterocyclic compound. The nitrogen-containing heterocyclic compound has a shared electron pair at a nitrogen atom, and therefore when an electron injection layer is included, the nitrogen-containing heterocyclic compound can cause an interaction, such as coordinate bonding, with an alkali metal or an alkaline earth metal contained in the electron injection layer. This can form some energy levels around the electron injection layer and the electron transport layer 6. As a result, these energy levels promote electron injection from the cathode 7. To induce such an interaction, the electron transport layer 6 is formed of a nitrogen-containing heterocyclic compound. To sufficiently cause an interaction with the electron injection layer, the electron transport layer 6 may have a thickness of 10 nm or more.

(5) The hole-blocking layer 5 is thicker than the electron transport layer 6, and the total thickness of the hole-blocking layer 5 and the electron transport layer 6 is 90 nm or more and less than 150 nm.

The hole-blocking layer 5 and the electron transport layer 6 satisfy relation (b) and relation (c). As described above, the hole-blocking layer 5 serves to inhibit holes from reaching the electron transport layer 6 and to confine exciton energy. When relation (b) and relation (c) are satisfied, the hole-blocking layer 5 is sufficiently thick. As a result, excitons generated in the first light-emitting layer 4a or at the interface between the first light-emitting layer 4a and the hole-blocking layer 5 can be inhibited from reaching the electron transport layer 6 by diffusion. This is because, in the case of an organic compound, the diffusion length of excitons is about 10 nm to 20 nm.

As described above, the electron transport layer 6 is formed of a nitrogen-containing heterocyclic compound and interacts with an electron injection layer, if included, and thus preferably does not enter an excited state if unnecessary. An element structure in which the hole-blocking layer 5 with high material stability is sufficiently thick can sufficiently inhibit diffusion of excitation energy to the electron transport layer 6 and improve durability.

When an electron injection layer is included, the electron transport layer 6 can also have a thickness required for the above-described interaction with the electron injection layer and cannot inhibit electron injection from the cathode 7.

The thickness of the electron injection layer is preferably 2 nm or less. This is because LiF or other metal used as the electron injection layer, if thick, can act as an insulating layer. The thickness is preferably 0.5 nm or more. This is because, if the thickness is too small, a uniform thin film cannot be formed, leading to uneven electron injection properties.

When relation (b) is not satisfied, that is, the electron transport layer 6 is thicker than the hole-blocking layer 5, a high voltage may be caused as described in EXAMPLES below.

Thus, in the case of a white organic EL element including stacked light-emitting layers, unlike the case of a monochromatic EL element, the order of stacking of the light-emitting layers and the relation with an adjacent layer, particularly, the hole-blocking layer 5 needs be considered to achieve good white-light emission and high durability. In particular, when the features (1) to (5) described above are satisfied, a white organic EL element excellent in durability and drive voltage can be provided.

In addition, in the case of an element structure that satisfies the following conditions (6) to (12), the effects of the features (1) to (5) described above are advantageously increased.

(6) A hole supply layer including the hole transport layer 3 has a small thickness.

The white organic EL element of the present disclosure may include, between the anode 2 and the first light-emitting layer 4a, a hole supply layer including the hole transport layer 3, and the hole supply layer and an electron supply layer may satisfy relation (d).

$$2.0 < d(E)/d(H) < 6.0, \text{ more preferably } 3.5 < d(E)/d(H) < 6.0 \quad (d)$$

d (E): total thickness of electron supply layer
d (H): total thickness of hole supply layer When the hole supply layer includes a hole injection layer, an electron-blocking layer, or both, the total thickness d (H) of the hole supply layer is the total thickness of the hole transport layer 3 and these layers.

When relation (d) is satisfied, the total thickness of the hole supply layer is smaller than the total thickness of the electron supply layer, and thus holes reaching the hole-blocking layer 5 relatively increase. This enables recombination regions to be localized on the cathode 7 side. That is, electrons reaching the hole transport layer 3 can be reduced to prevent deterioration of the hole transport layer 3. In addition, localizing recombination regions at or near the hole-blocking layer 5 with high chemical stability can achieve improved durability and white-light emission.

The hole supply layer may have a thickness of 15 nm or more. This is because the hole supply layer in the present disclosure may be constituted by three layers: the hole injection layer, the hole transport layer 3, and the electron-blocking layer, and each layer may have a thickness of 5 nm or more in order to sufficiently exhibit its function. The hole supply layer may have a thickness of 35 nm or less. This is because if the hole supply layer is thicker than 35 nm, then the electron supply layer is relatively thick, leading to a large thickness of the entire element, which may cause a high voltage.

(7) The light-emitting layers other than the first light-emitting layer 4a also have electron-trapping properties.

To more efficiently localize recombination regions on the cathode 7 side, the light-emitting layers other than the first light-emitting layer 4a may also have electron-trapping properties. For example, as illustrated in FIG. 1A, when the second light-emitting layer 4b and the third light-emitting layer 4c are provided between the anode 2 and the first light-emitting layer 4a, these light-emitting layers may also be light-emitting layers having electron-trapping properties. Specifically, the second host and the second dopant contained in the second light-emitting layer 4b may satisfy relation (e), and the third host and the third dopant contained in the third light-emitting layer 4c may satisfy relation (f).

$$\text{LUMO}(H2) > \text{LUMO}(D2) \quad (e)$$

$$\text{LUMO}(H3) > \text{LUMO}(D3) \quad (f)$$

LUMO (H2): LUMO energy of second host
LUMO (D2): LUMO energy of second dopant
LUMO (H3): LUMO energy of third host
LUMO (D3): LUMO energy of third dopant As illustrated in FIG. 1B, when the second light-emitting layer 4b is provided between the anode 2 and the first light-emitting layer 4a without the third light-emitting layer 4c, the following relations may be satisfied. That is, the second host and the second dopant contained in the second light-emitting layer 4b may satisfy relation (g), and the second host and the third dopant may satisfy relation (h).

$$\mathrm{LUMO}(H2) > \mathrm{LUMO}(D2) \quad (g)$$

$$\mathrm{LUMO}(H2) > \mathrm{LUMO}(D3) \quad (h)$$

LUMO (H2): LUMO energy of second host
LUMO (D2): LUMO energy of second dopant
LUMO (D3): LUMO energy of third dopant In the case of the layer structure as illustrated in FIG. 1B, since the red dopant and the green dopant having different band gaps coexist in the second light-emitting layer 4b, energy transfer to the red dopant having a narrower band gap is likely to occur. Thus, the doping concentration of the red dopant may be lower than the doping concentration of the green dopant. The ratio of the concentration of the red dopant to the concentration of the green dopant is preferably ⅕ or less, more preferably 1/10 or less, by mass. This enables adjustment of the balance of light emission intensity between the red and green dopants.

The thickness of each of the light-emitting layers is preferably 30 nm or less. When the light-emitting layers in the present disclosure have high electron-trapping properties, they may increase resistance in terms of carrier transport. Thus, if the light-emitting layers are excessively thick, an increase in drive voltage may occur. More preferably, the thickness is 20 nm or less. On the other hand, the thickness of each of the light-emitting layer is preferably 5 nm or more. This is for allowing the light emission properties of the light-emitting layers to be sufficiently exhibited, and for allowing an electron-trapping function to be sufficiently exhibited in the case of light-emitting layers having electron-trapping properties.

In this specification, the term "blue dopant" refers to a luminescent material whose emission spectrum has a peak wavelength of 430 nm to 480 nm. The term "green dopant" refers to a luminescent material whose emission spectrum has a peak wavelength of 500 nm to 570 nm, and the term "red dopant" refers to a luminescent material whose emission spectrum has a peak wavelength of 580 nm to 680 nm.

(8) Electron-trapping properties of each light-emitting layer are higher than its hole-trapping properties.

Being a light-emitting layer having electron-trapping properties has the effect of not only preventing deterioration of the hole transport layer 3 but also improving durability. This will be described below.

"Science, 283, 1900-1902 (1999)" suggests that instability of radical cations generated as a result of hole conduction is partly responsible for deterioration of tris(8-quinolinato) aluminum (AlQ3), a host of a light-emitting layer. To prevent such radical-cation-induced deterioration in a light-emitting layer, the hole density in the light-emitting layer may be reduced to thereby decrease the probability of generation of radical cations. This can be achieved by increasing the electron density in the light-emitting layer by reducing hole-trapping properties and improving electron-trapping properties.

Specifically, referring to the second light-emitting layer 4b in FIG. 2, relation (i) may be satisfied.

$$\mathrm{LUMO}(H2) - \mathrm{LUMO}(D2) > \mathrm{HOMO}(D2) - \mathrm{HOMO}(H2) \quad (i)$$

When relation (i) is satisfied, the second light-emitting layer 4b can have reduced hole-trapping properties and improved electron-trapping properties.

(9) The HOMO energy of the first dopant of the first light-emitting layer 4a is lower than the HOMO energy of the first host (far from the vacuum level).

As shown by the first light-emitting layer 4a in FIG. 2, relation (j) may be satisfied.

$$\mathrm{HOMO}(H1) > \mathrm{HOMO}(D1) \quad (j)$$

When relation (j) is satisfied, hole-trapping properties can be further reduced, and electron-trapping properties can be relatively improved. As a result, the increased electron density can increase recombination probability, resulting in a reduced hole density. Furthermore, reducing the hole-trapping properties of the first light-emitting layer 4a increases the number of holes reaching the hole-blocking layer 5. This enables recombination regions to be localized on the cathode side.

(10) Each host material is a hydrocarbon.

In the present disclosure, the compound used as a host is not particularly limited, and a compound having no low-binding-stability bonds in its molecular structure may be used. This is because if a compound having, in its molecular structure, a low-binding-stability bond, that is, an unstable bond with a low binding energy is contained in any of the light-emitting layers as a host, the compound is likely to deteriorate during element operation and highly likely to adversely affect the operating life of the EL element.

For example, in the case of a compound CBP ([4,4'-bis (carbazol-9-yl)biphenyl]) shown below, the low-binding-stability bond is a bond (nitrogen-carbon bond) that binds a carbazole ring and a phenylene group together. Calculated values of binding energy of CBP and an exemplary host compound EM1 are compared below. The calculation is performed using b3-lyp/def2-SV(P).

Binding Energy (Calculated Values)

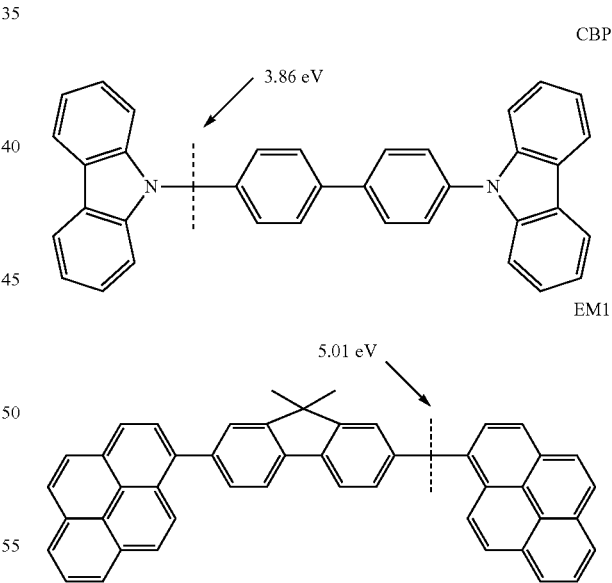

The above results show that the host material of the organic EL element of the present disclosure may be a hydrocarbon which is formed by carbon-carbon bonds and has high binding stability. However, when the host material is a hydrocarbon, the LUMO energy of the host is low (far from the vacuum level), and thus the LUMO energy of the dopant is also required to be low (far from the vacuum level) in order to form a light-emitting layer having high electron-trapping properties.

(11) Each dopant has a fluoranthene skeleton.

Thus, in the present disclosure, the compound used as a dopant is not particularly limited, but in terms of the electron-trapping properties described above, a compound having a fluoranthene skeleton which is an electron-withdrawing structure may be used. This is because the presence of a fluoranthene skeleton makes LUMO energy low (far from the vacuum level). This increases the difference in LUMO energy from the host material, thus improving electron-trapping properties. The compound need not necessarily have an electron-donating substituted amino group. This is because a compound having a substituted amino group has a high LUMO energy (close to the vacuum level) and low electron-trapping properties.

Also in terms of binding stability, a compound that does not have a substituted amino group that forms a nitrogen-carbon bond may be used.

Thus, when the host material is a hydrocarbon, and the dopant is a compound having a fluoranthene skeleton and no substituted amino groups, a light-emitting layer having high electron-trapping properties can be formed, and the material itself forming the light-emitting layer has high stability. Thus, an organic EL element having high durability can be provided.

Now the fluoranthene skeleton will be described. The term "fluoranthene skeleton" refers to a fluoranthene ring or a fused polycyclic skeleton formed of a fluoranthene ring and an aromatic hydrocarbon fused together. Specific examples include fused polycyclic skeletons FF1 to FF30 below.

FF1

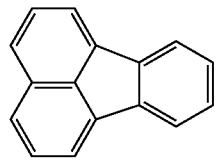

FF2

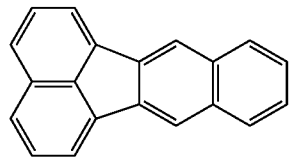

FF3

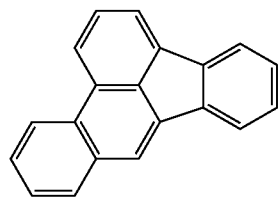

FF4

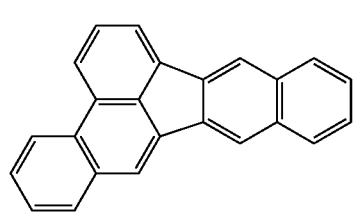

-continued

FF5

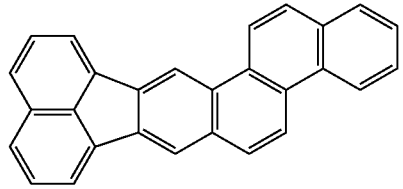

FF6

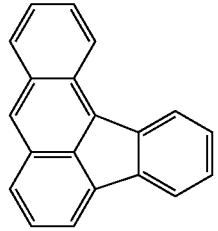

FF7

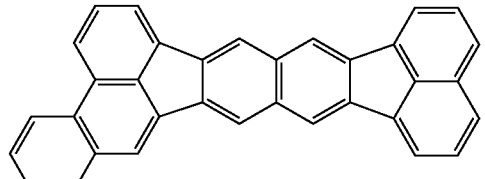

FF8

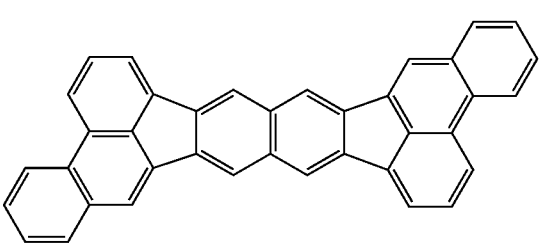

FF9

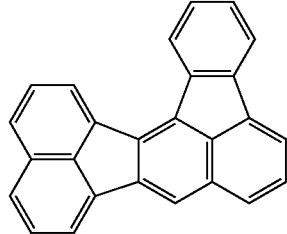

FF10

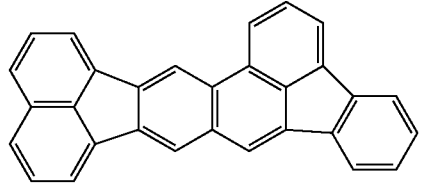

FF11

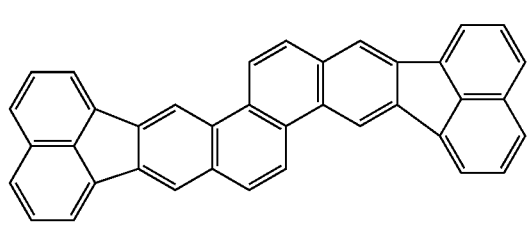

FF12
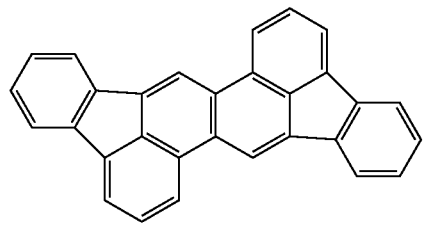
FF13
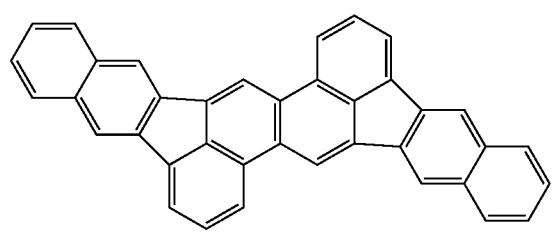
FF14
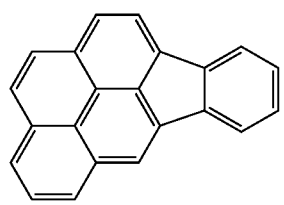
FF15
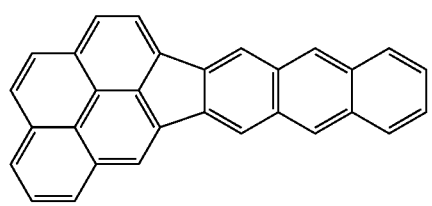
FF16
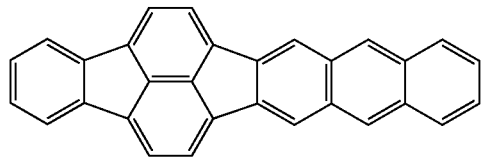
FF17
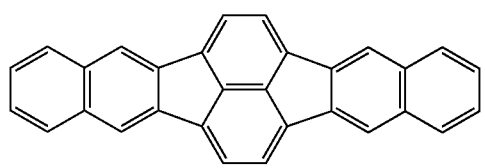
FF18
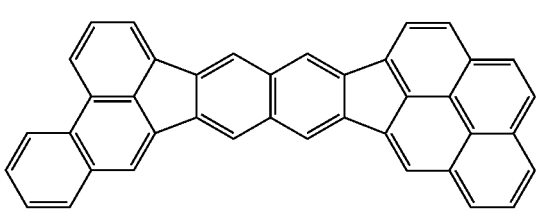
FF19
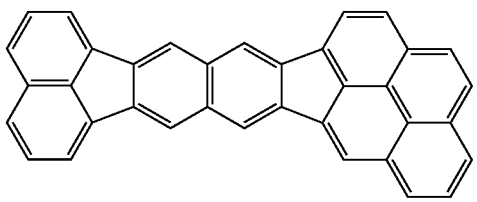
FF20
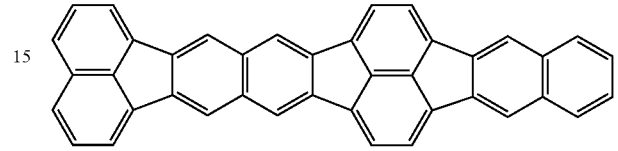
FF21
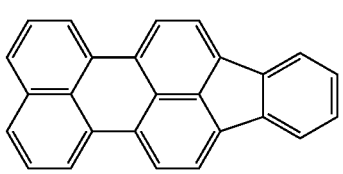
FF22
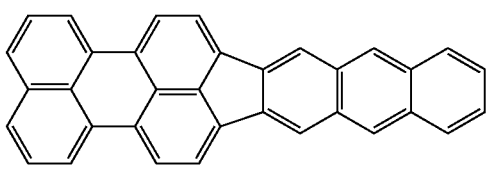
FF23
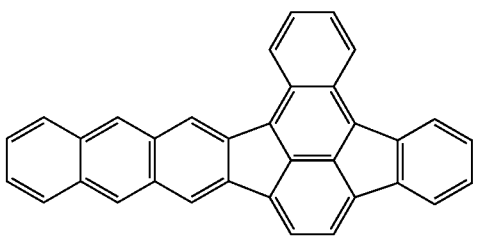
FF24
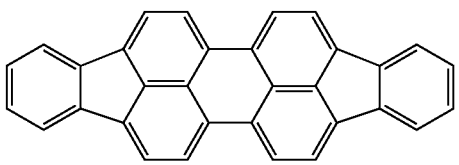
FF25
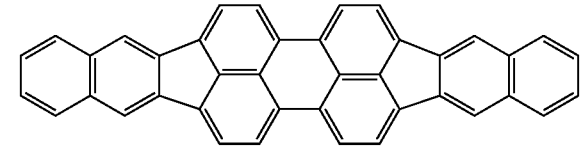
FF26
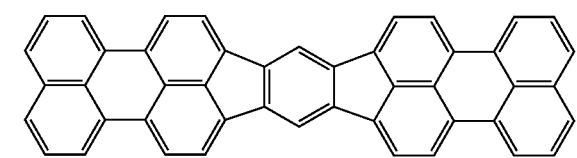

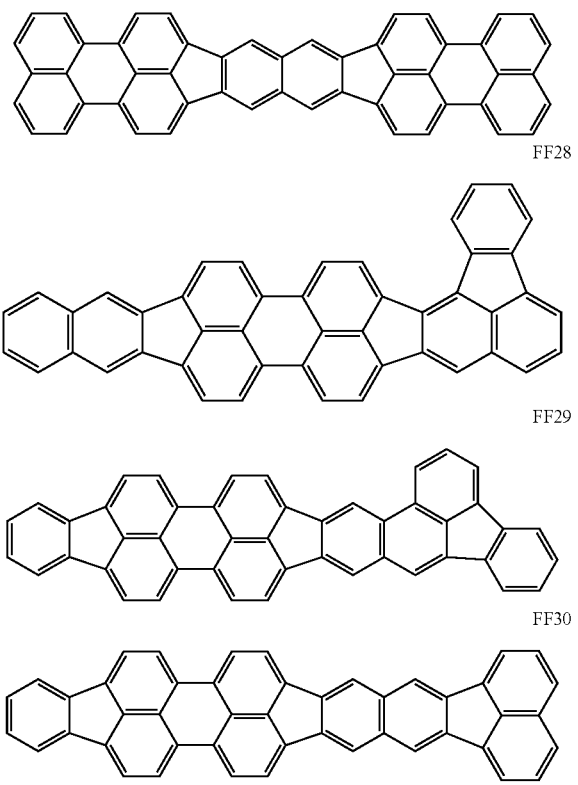

Of these, to improve electron-withdrawing properties and improve electron-trapping properties, the dopant may have a structure containing two or more fluoranthene rings (the fluoranthene rings may share some aromatic rings), preferably a structure containing two or more fluoranthene rings fused together. Specifically, dopants having skeletons FF7 to FF13, FF16 to FF20, and FF23 to FF30 are suitable for use in the present disclosure.

(12) The material constituting the hole-blocking layer 5 has a higher T1 energy than fluoranthene.

When the dopant is a compound having a fluoranthene skeleton, the T1 energy of the material of the hole-blocking layer is preferably higher than that of the compound, more preferably higher than that of fluoranthene. The compound constituting the hole-blocking layer may be an aromatic hydrocarbon having a molecular structure constituted by an aromatic hydrocarbon ring selected from a benzene ring, a naphthalene ring, a fluorene ring, a benzofluorene ring, a phenanthrene ring, a chrysene ring, and a triphenylene ring. This is because these aromatic hydrocarbon rings have higher T1 energies than a fluoranthene ring, as shown in Table 1. The T1 energies shown in Table 1 are calculated using B3LYP/6-31G*.

TABLE 1

| | Structural formula | T1 |
|---|---|---|
| Benzene | 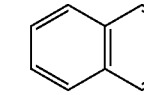 | 339 nm |
| Naphthalene | 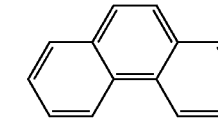 | 472 nm |
| Phenanthrene | 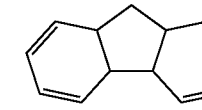 | 459 nm |
| Fluorene | 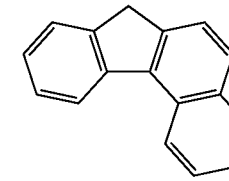 | 422 nm |
| Benzo [c] fluorene | 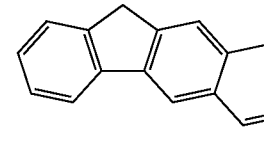 | 507 nm |
| Benzo [b] fluorene | 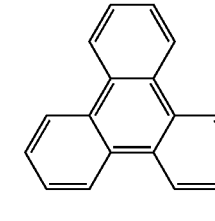 | 491 nm |
| Triphenylene | 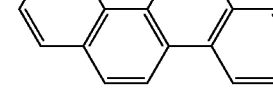 | 427 nm |
| Chrysene | 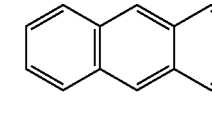 | 500 nm |
| Anthracene |  | 672 nm |
| Pyrene |  | 589 nm |
| Fluoranthene | | 522 nm |

TABLE 1-continued

| | Structural formula | T1 |
|---|---|---|
| Benzo [k] fluoranthene | 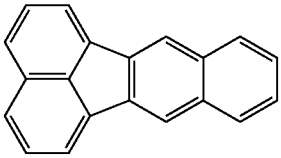 [SMILES: c1ccc2cc3c(cc2c1)-c1cccc2cccc-3c12] | 552 nm |

For the organic compound according to the present disclosure, whether the organic EL element contains the organic compound according to the present disclosure can be determined by analyzing the organic compound layer of the organic EL element, for example, by TOF-SIMS. Whether the organic EL element satisfies the thickness relations according to the present disclosure can be determined by performing an analysis, for example, by GCIB-TOF-SIMS. The analysis may be performed by other methods, for example, by extracting an organic compound from the organic EL element and analyzing the compound by IR, UV, or NMR.

Specific examples of hosts used in the present disclosure are shown below. These compounds are given by way of illustration and not by way of limitation.

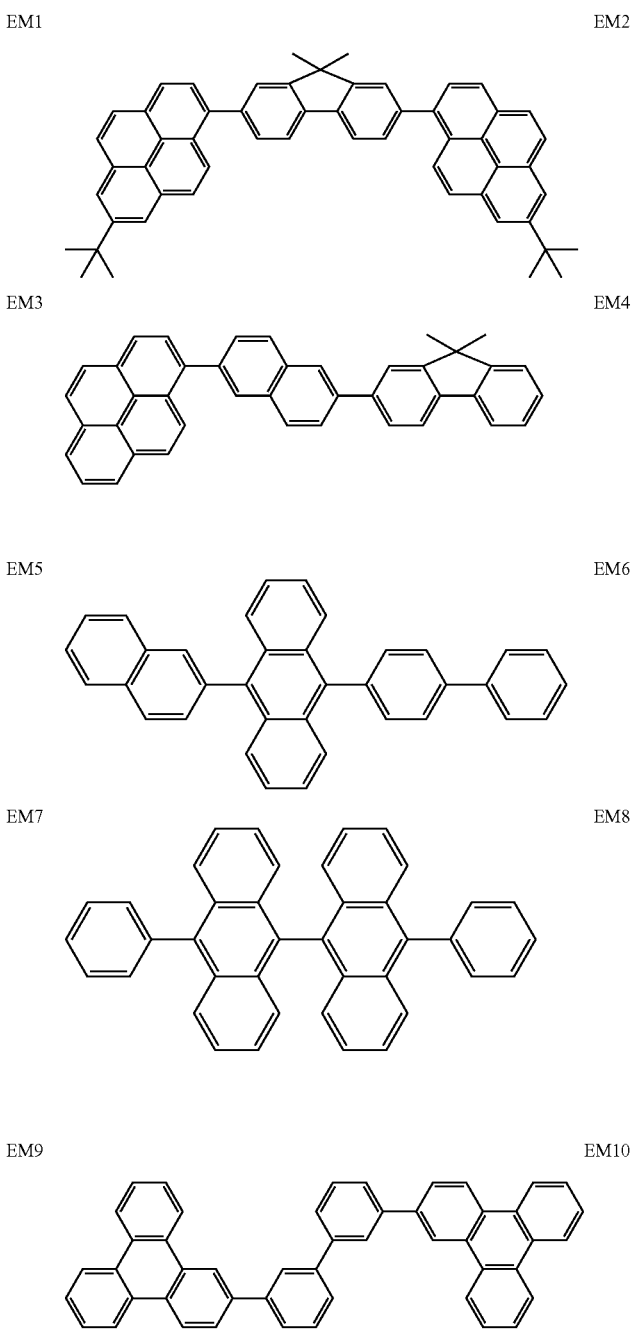

-continued
EM11
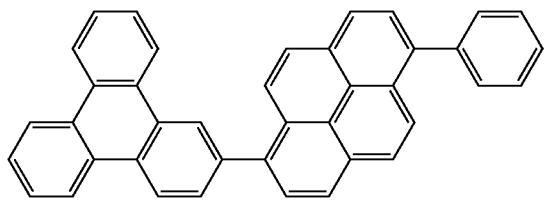
EM12
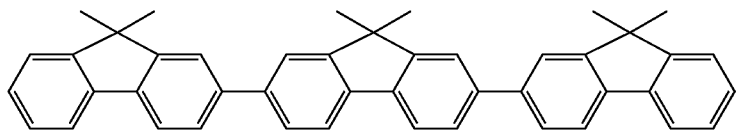
EM13
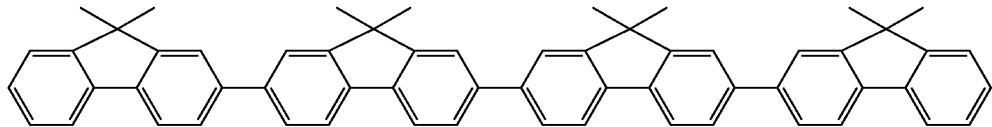
EM14
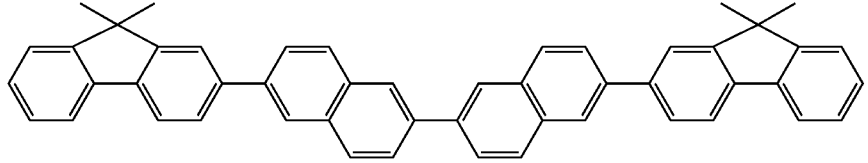
EM15
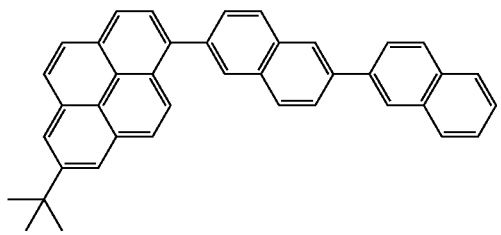
EM16
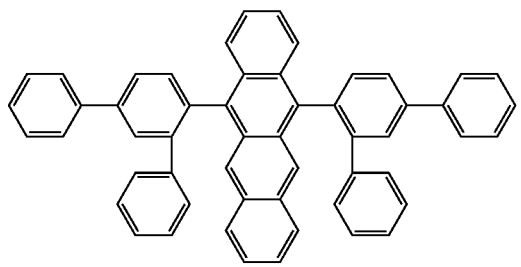
EM17
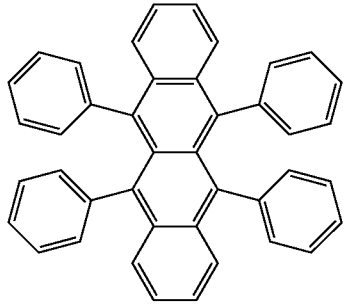
EM18
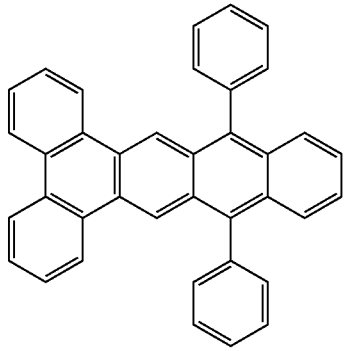
EM19
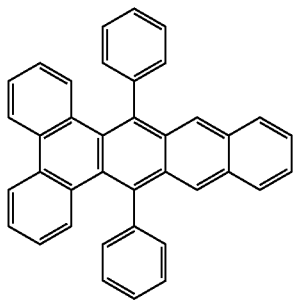
EM20
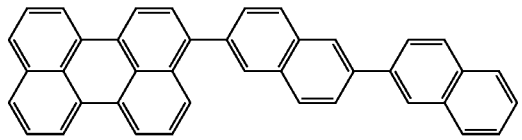

-continued
EM21
EM22
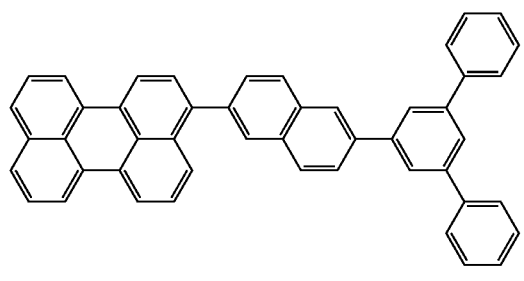
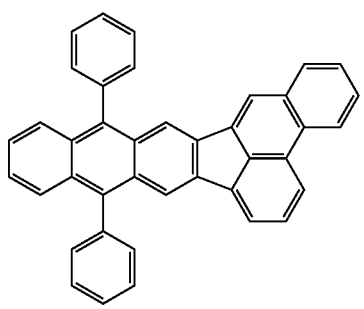
EM23
EM24
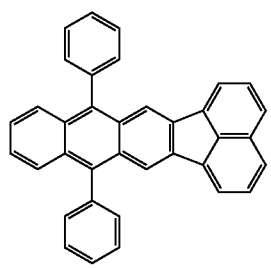
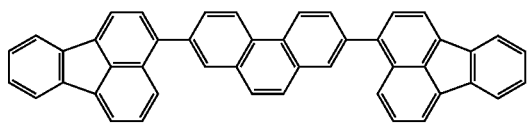
EM25
EM26
EM27
EM28
EM29
EM30
EM31

Among the hosts illustrated, EM1 to EM26, each being a hydrocarbon, may be used in terms of the above-described binding stability. This is because these hosts can provide an organic EL element having high durability.
Examples of blue dopants usable in the present disclosure include, but are not limited to, the following.
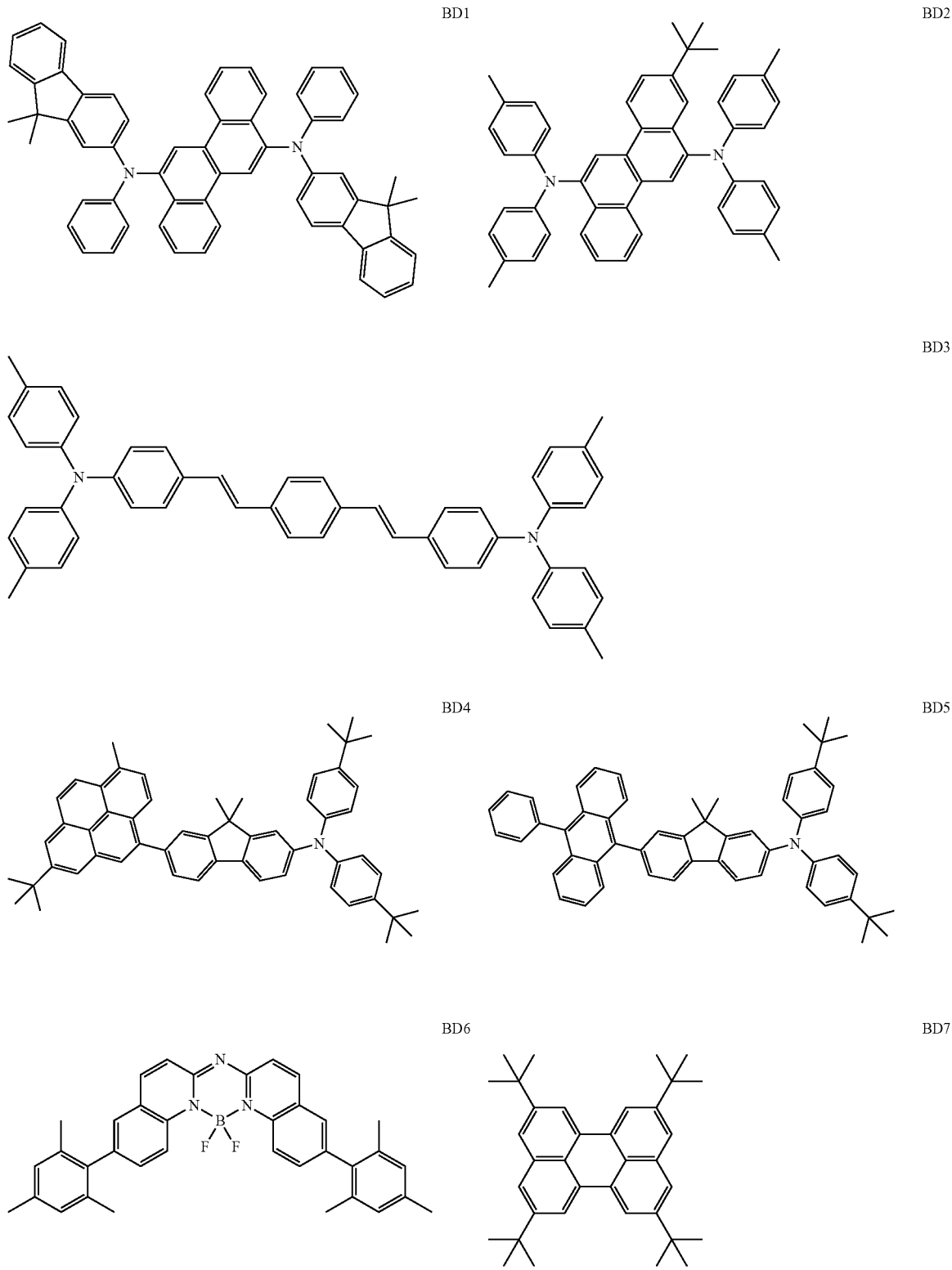

-continued
BD8
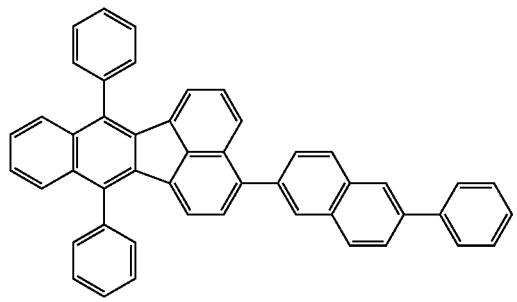
BD9
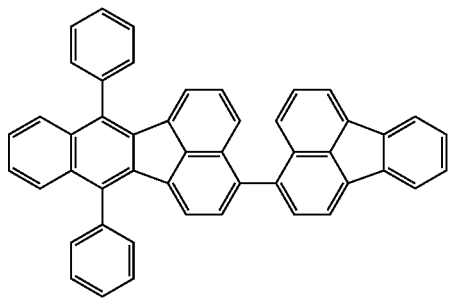
BD10
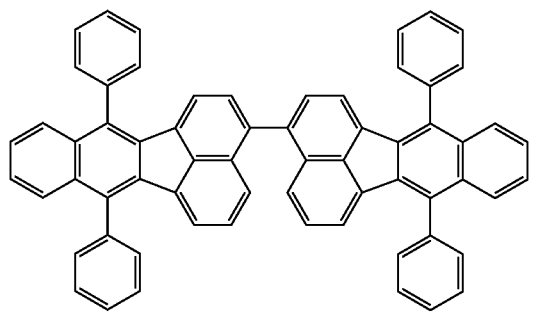
BD11
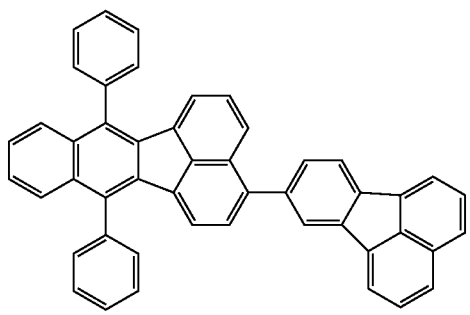
BD12
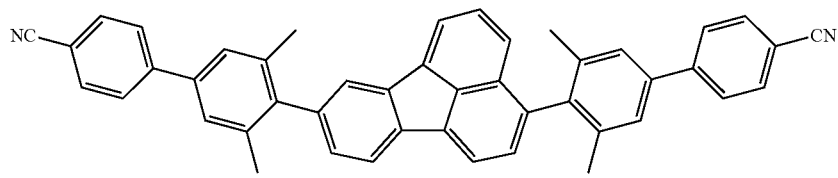
BD13
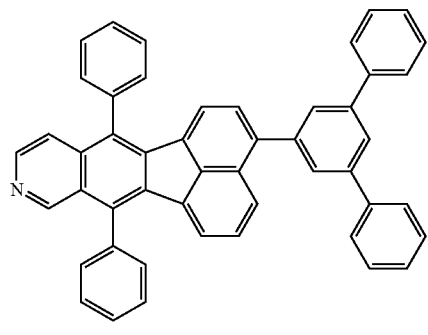
BD14
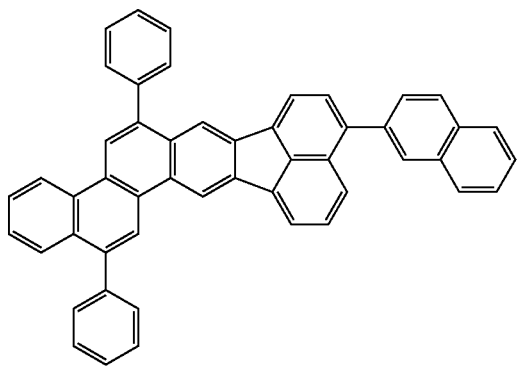

-continued
BD15
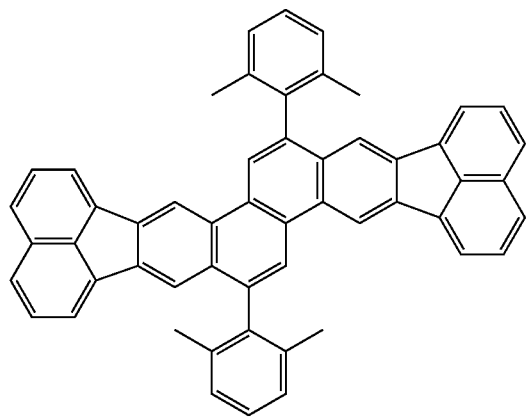
BD16
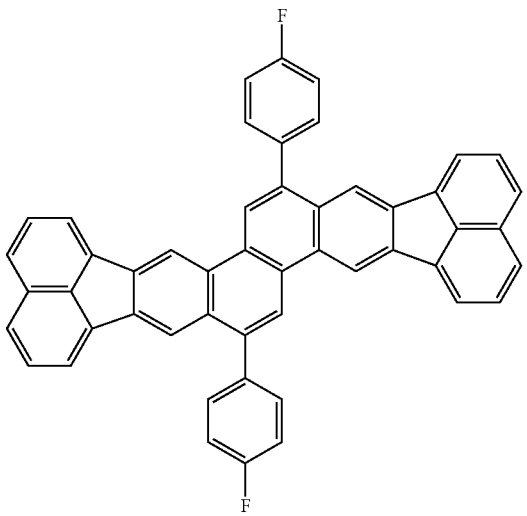
BD17
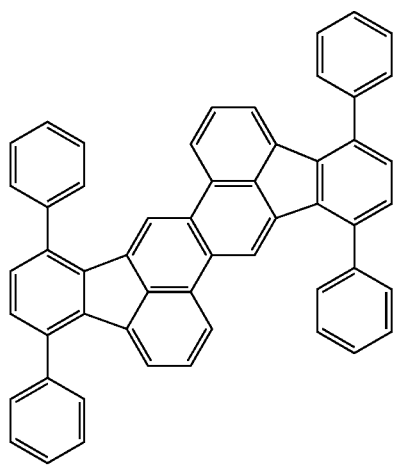
BD18
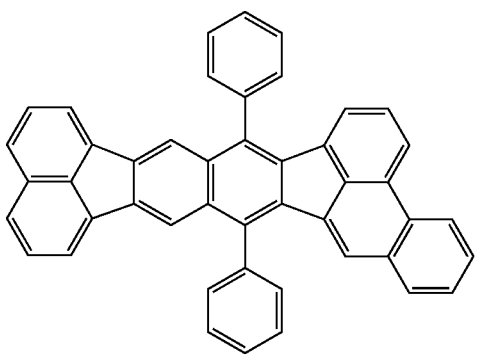
BD19
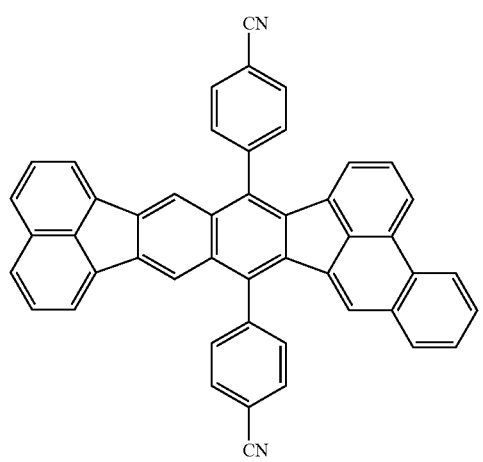
BD20
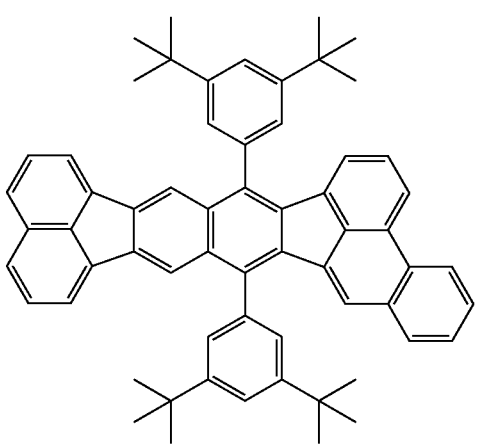

-continued
BD21
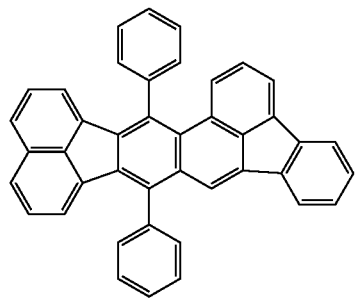
BD22
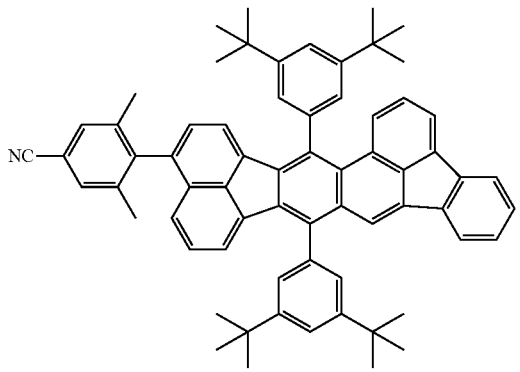
BD23
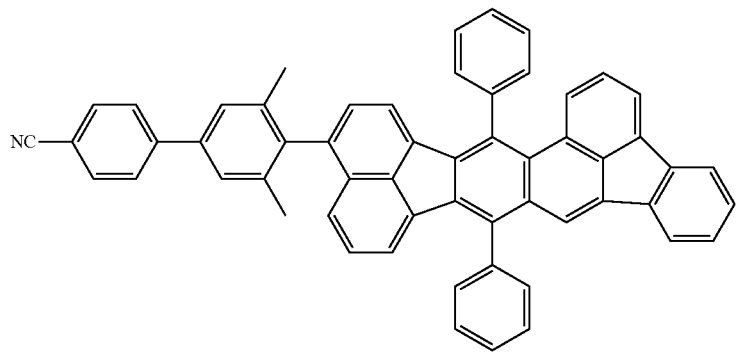
BD24
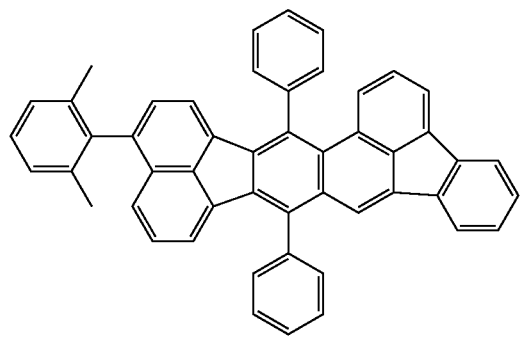
BD25
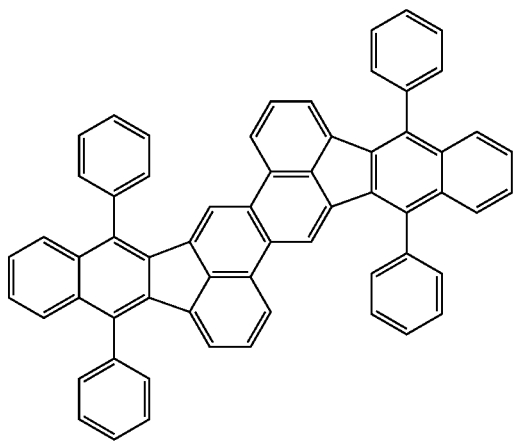
BD26
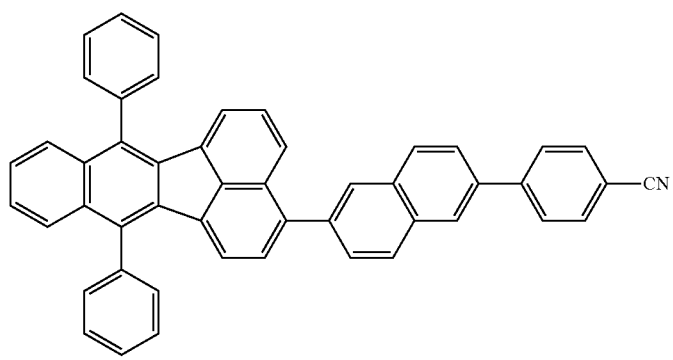

-continued

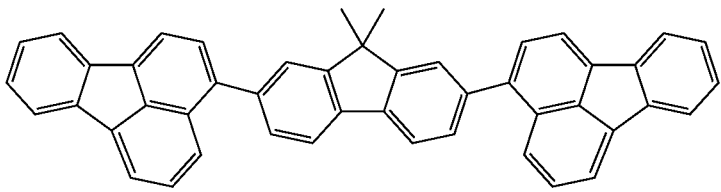
BD27

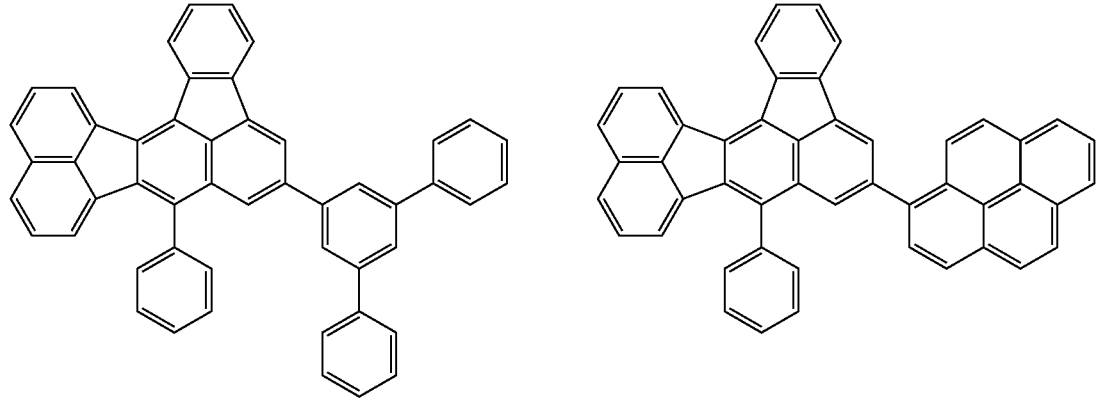
BD28
BD29

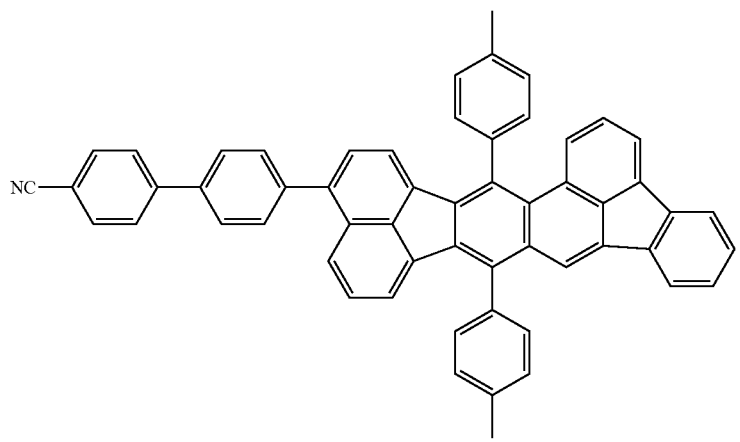
BD30

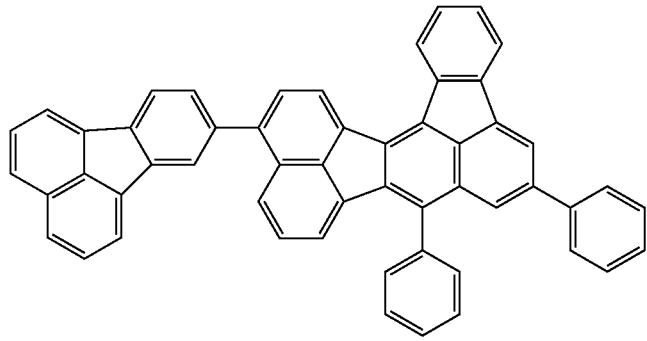
BD31

Among the blue dopants illustrated, BD8 to BD31, each having a fluoranthene skeleton, may be used in terms of electron-trapping properties. Compounds not having a substituted amino group, which has strong electron-donating properties, may be used. Furthermore, compounds having a cyano group, which has strong electron-withdrawing properties, may be used. This is because the presence of a cyano group can make the LUMO energy of the dopant low (far from the vacuum level) and provide a light-emitting layer with enhanced electron-trapping properties. The doping concentrations of the blue dopants are each preferably 0.1 mass % or more and 10 mass % or less, more preferably 0.3 mass % or more and 5 mass % or less. An excessively low concentration may disadvantageously reduce electron-trapping probability to thereby reduce recombination probability, leading to a low blue-light emission intensity. By contrast, an excessively high concentration may disadvantageously cause concentration quenching.

Examples of green dopants usable in the present disclosure include, but are not limited to, the following.
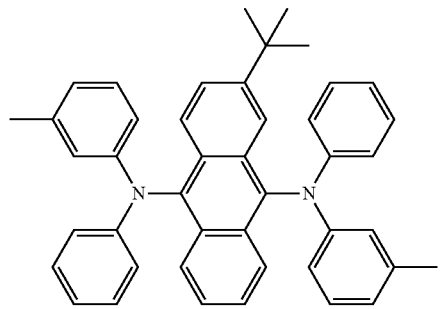
GD1
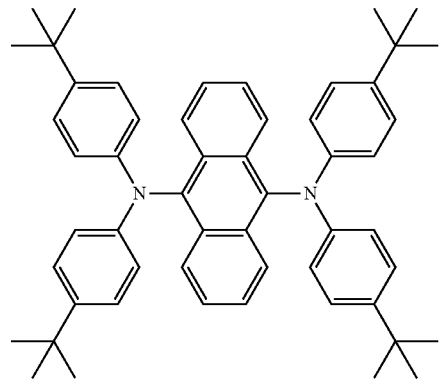
GD2
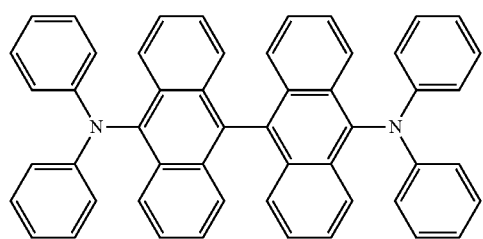
GD3
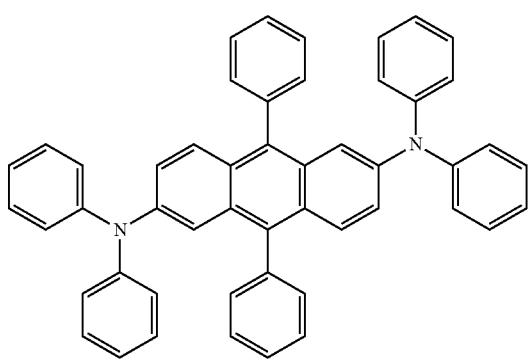
GD4
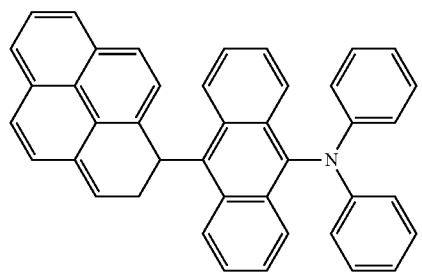
GD5
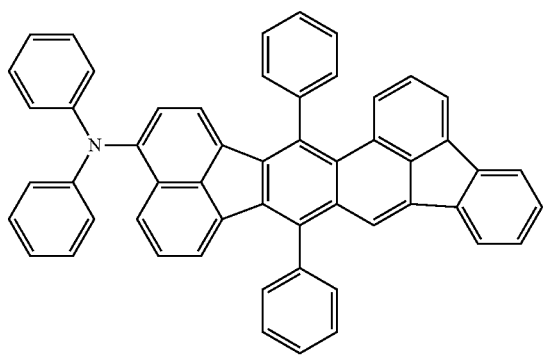
GD6
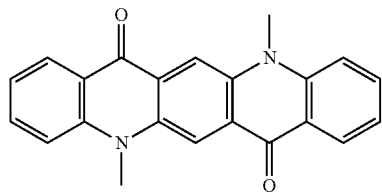
GD7
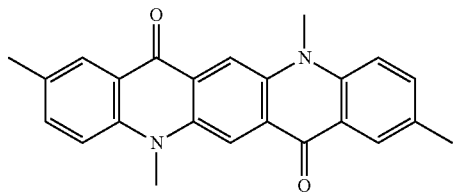
GD8

-continued
GD9
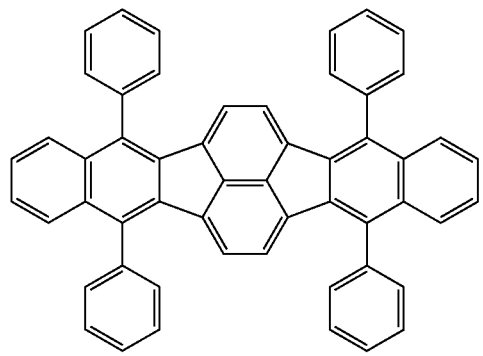
GD10
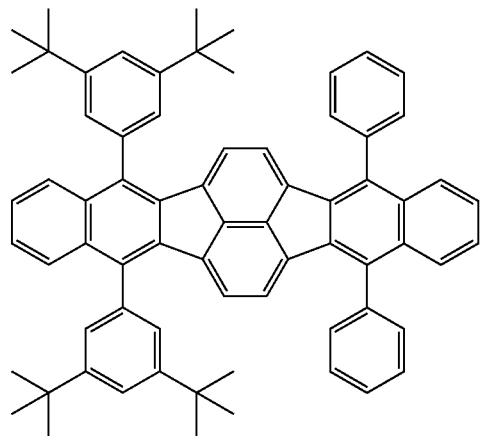
GD11
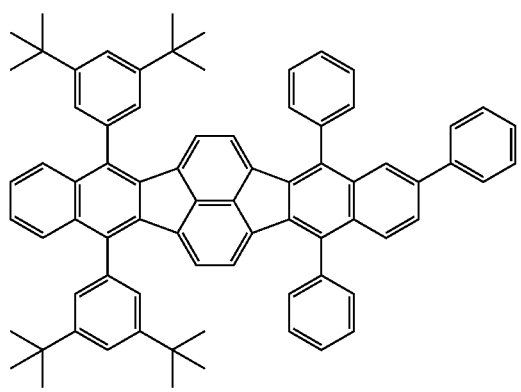
GD12
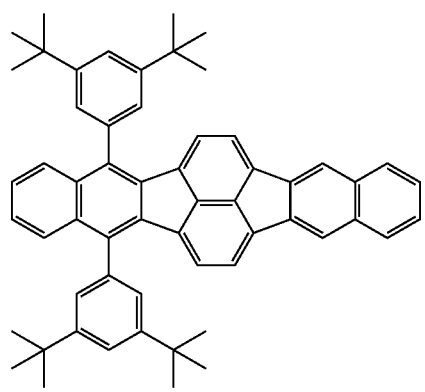
GD13
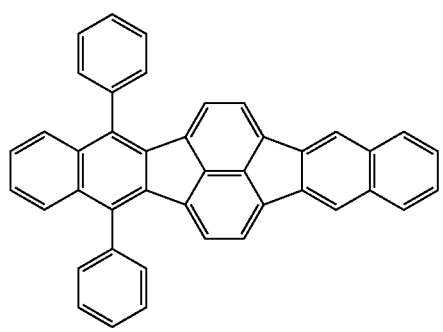
GD14
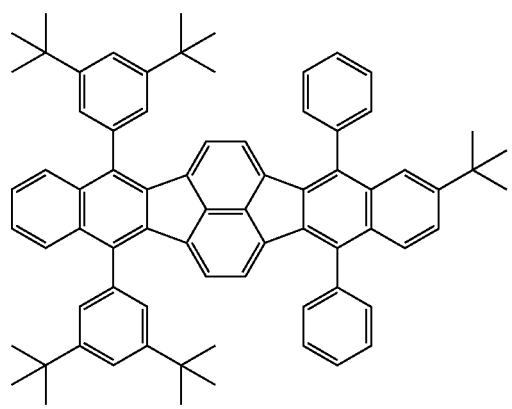

-continued
GD15
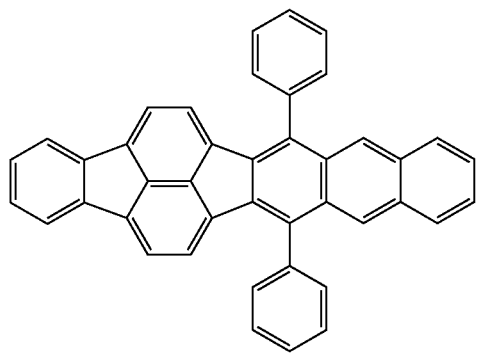
GD16
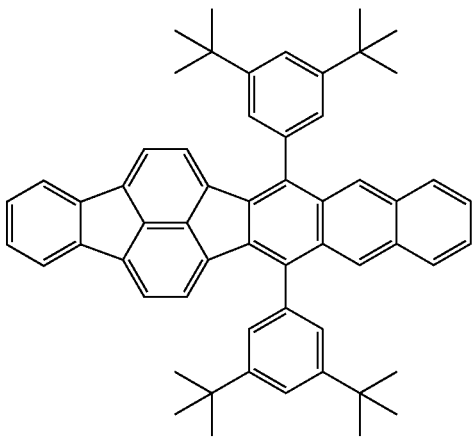
GD17
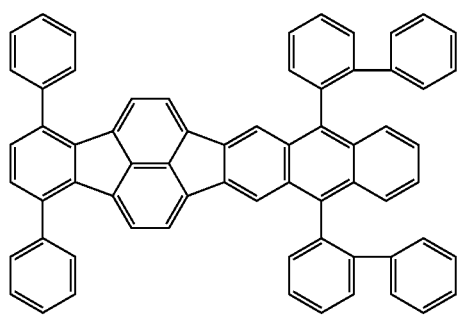
GD18
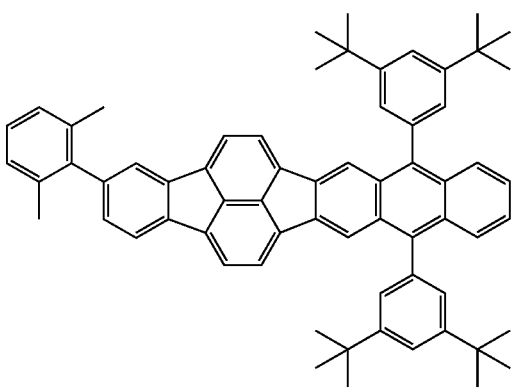
GD19
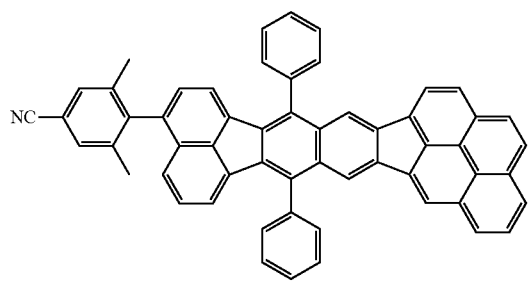
GD20
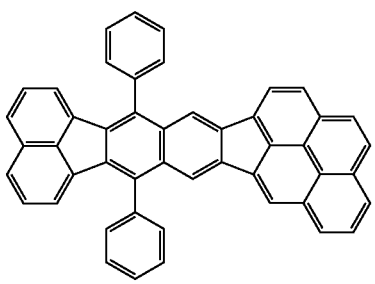
GD21
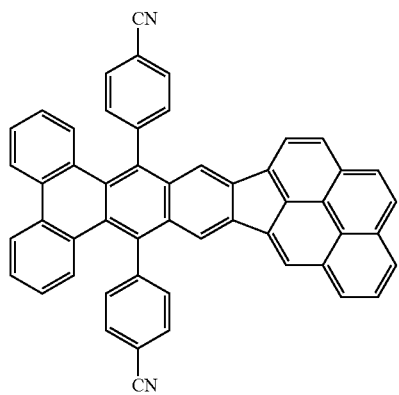
GD22
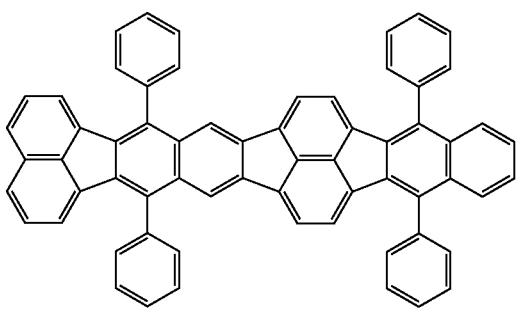

-continued
GD23
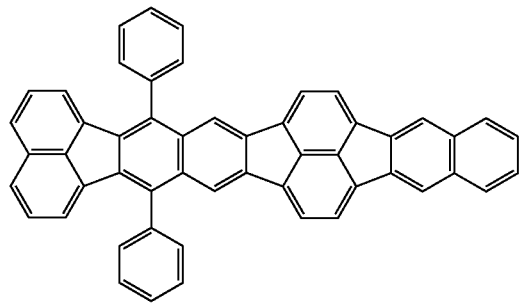
GD24
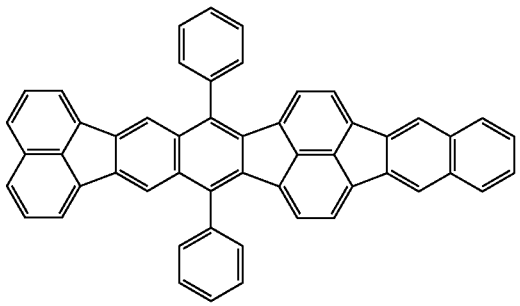
GD25
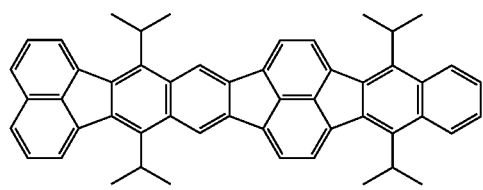
GD26
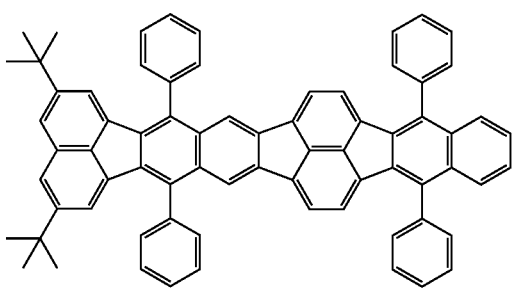
GD27
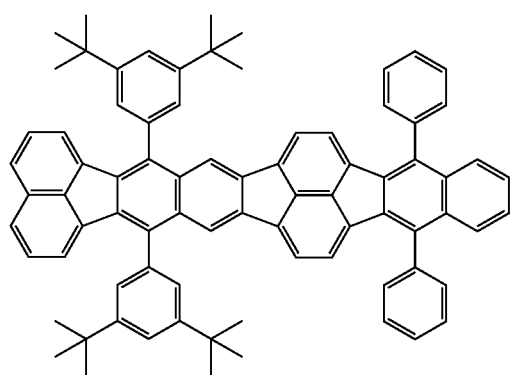
GD28
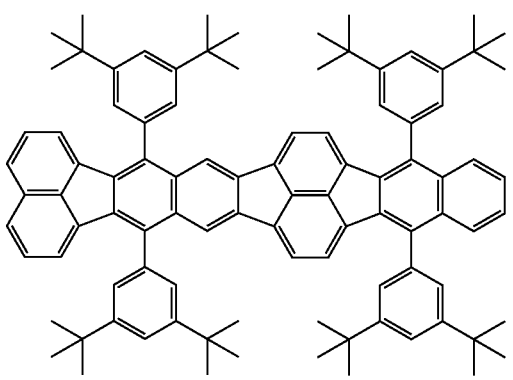
GD29
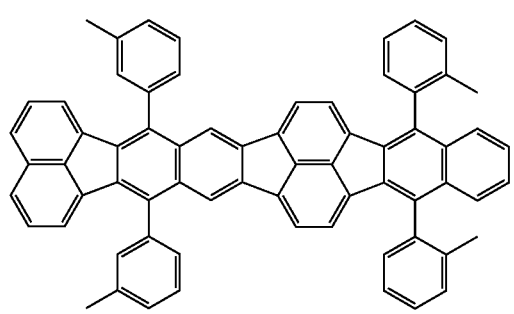

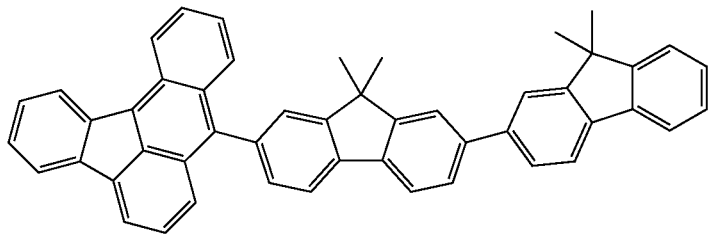

GD30

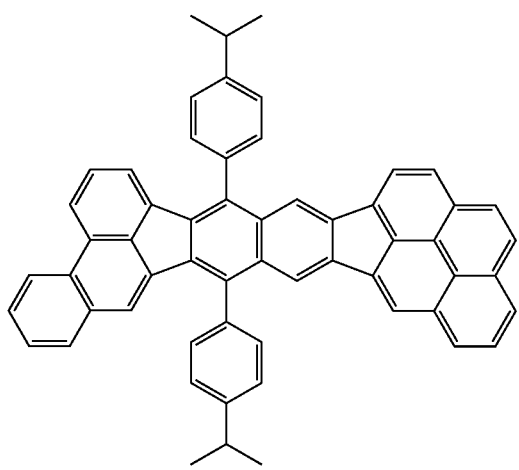

GD31

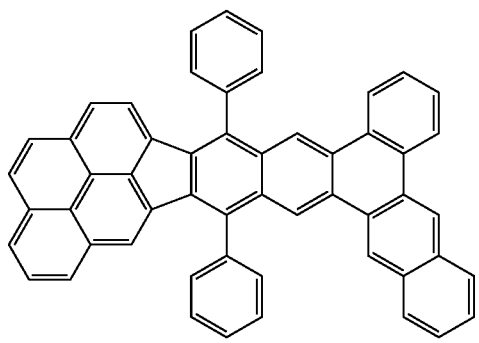

GD32

Among the green dopants illustrated, GD6 and GD9 to GD32, each having a fluoranthene skeleton, may be used in terms of electron-trapping properties. Compounds not having a substituted amino group which has strong electron-donating properties may be used. The doping concentrations of the green dopants are each preferably 0.1 mass % or more and 10 mass % or less, more preferably 0.3 mass % or more and 5 mass % or less. An excessively low concentration may disadvantageously reduce electron-trapping probability to thereby reduce recombination probability, leading to a low green-light emission intensity. By contrast, an excessively high concentration may disadvantageously cause concentration quenching.

Examples of red dopants usable in the present disclosure include, but are not limited to, the following.

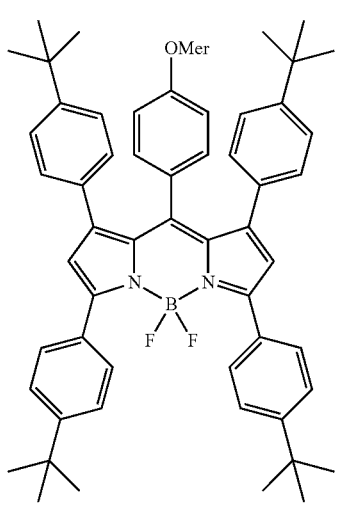

RD1

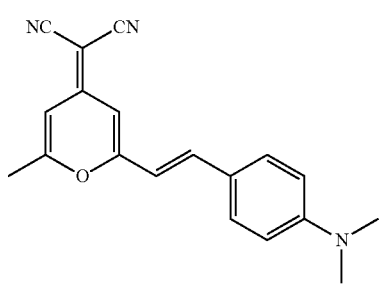

RD2

-continued
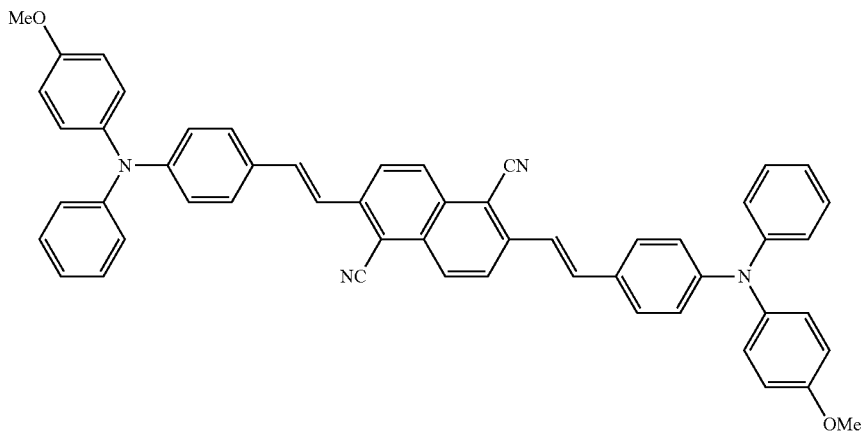
RD3
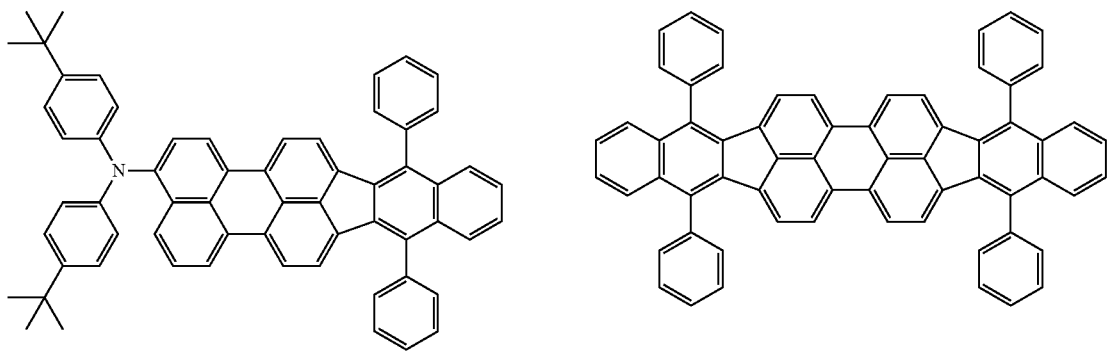
RD4    RD5
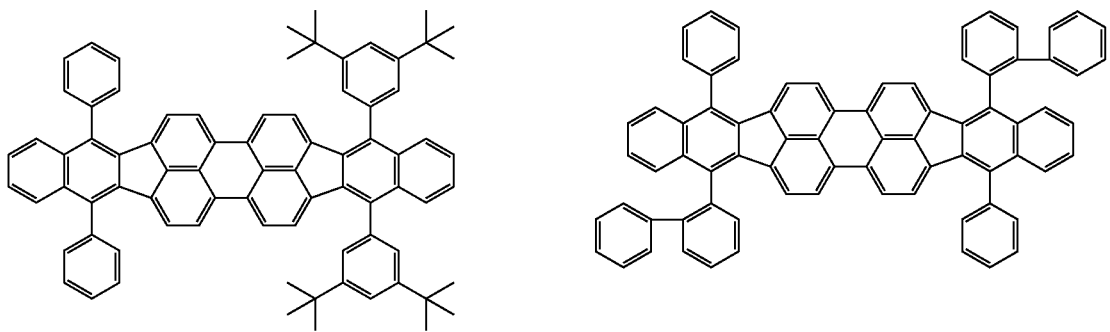
RD6    RD7
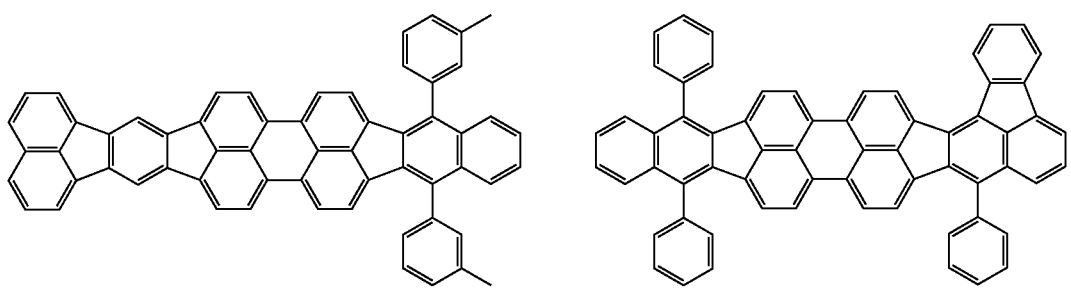
RD8    RD9

RD10
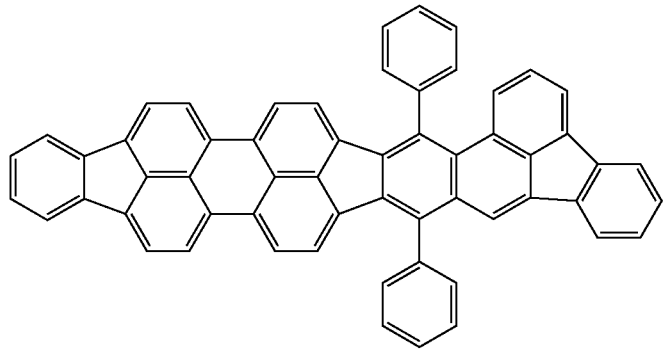
RD11
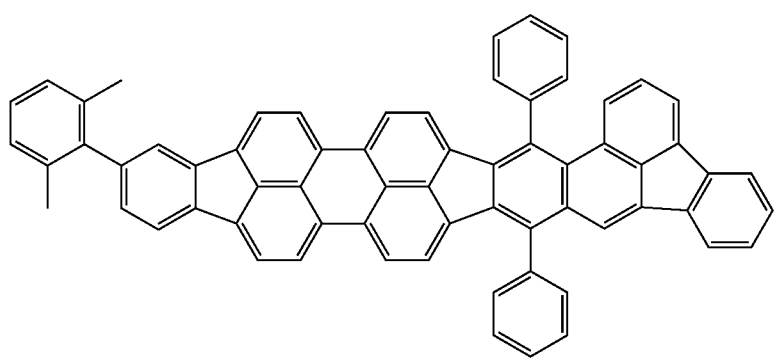
RD12
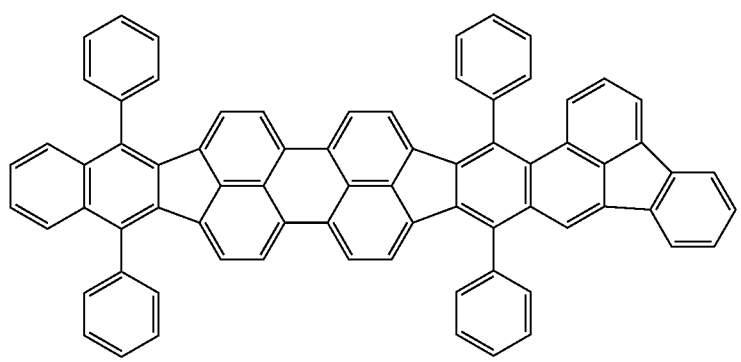
RD13
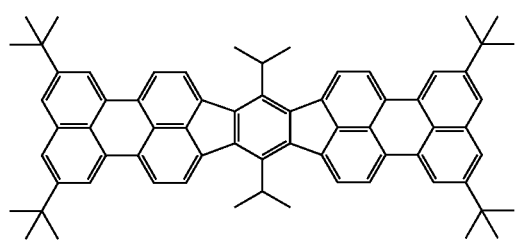
RD14
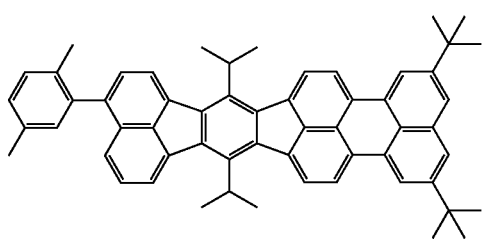

-continued
RD15
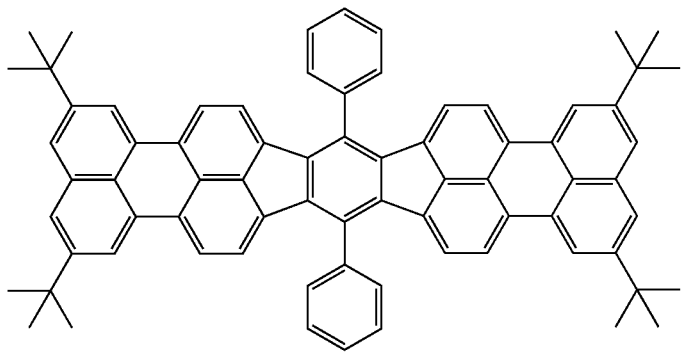
RD16
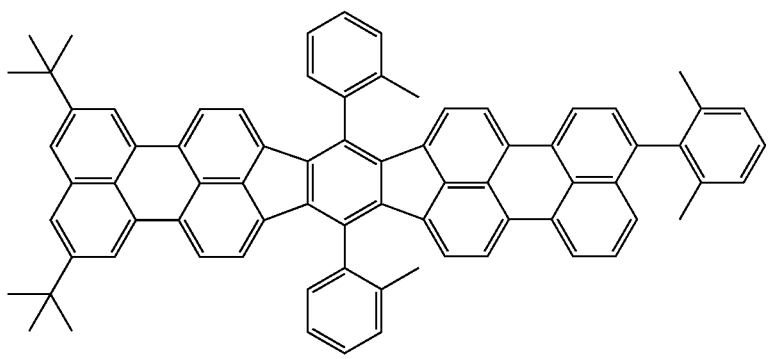
RD17
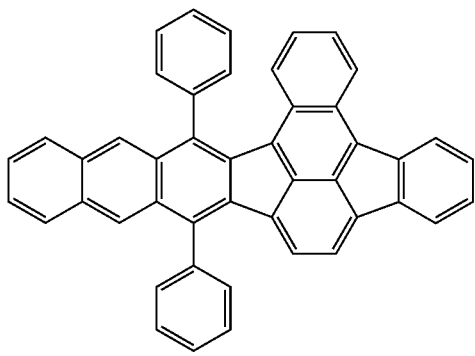
RD18
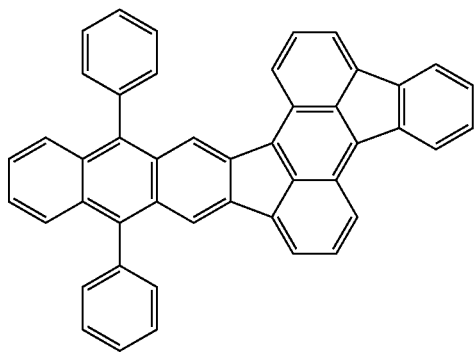
RD19
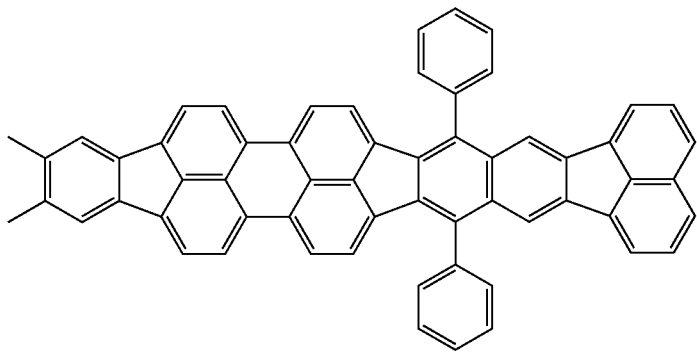

-continued

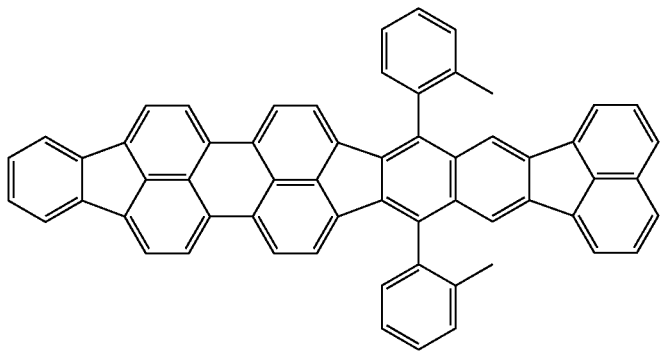
RD20

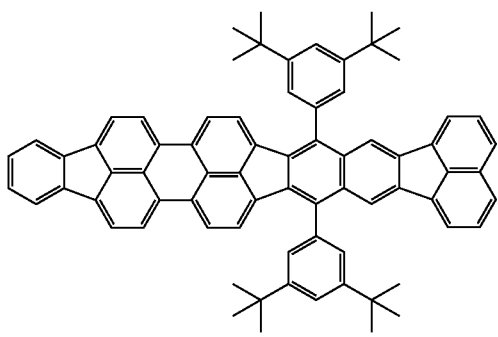
RD21

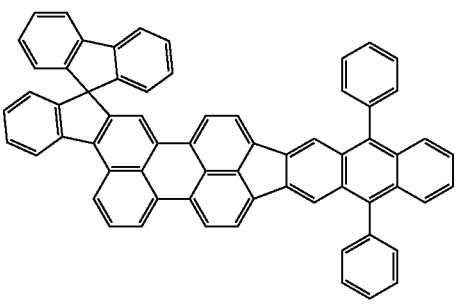
RD22

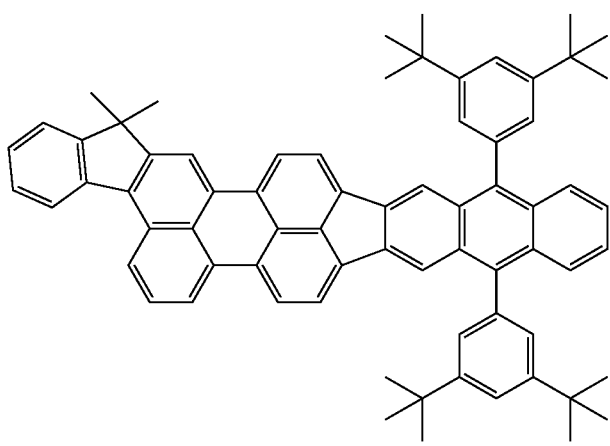
RD23

Among the red dopants illustrated, RD4 to RD23, each having a fluoranthene skeleton, may be used. In terms of binding stability, hydrocarbons may be used. The doping concentrations of the red dopants are each preferably 0.1 mass % or more and 5 mass % or less, more preferably 0.1 mass % or more 0.5 mass %. An excessively low concentration may disadvantageously reduce electron-trapping probability to thereby reduce recombination probability, leading to a low red-light emission intensity. By contrast, an excessively high concentration may disadvantageously cause concentration quenching.

Specific examples of hole-blocking layer materials usable in the present disclosure are shown below. These compounds are given by way of illustration and not by way of limitation.

HB1 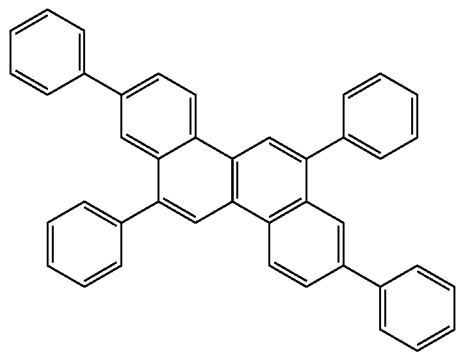 HB2 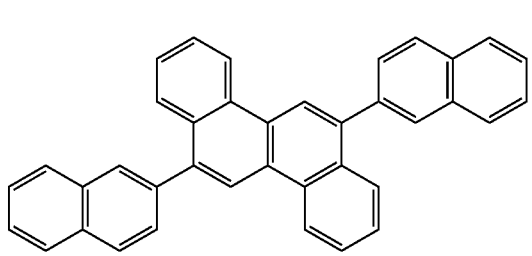
HB3 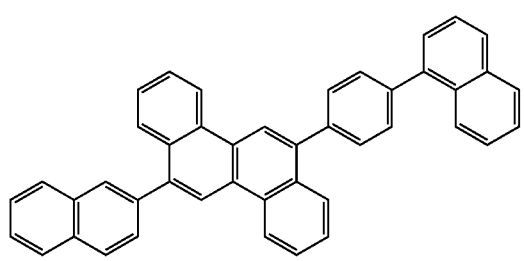 HB4 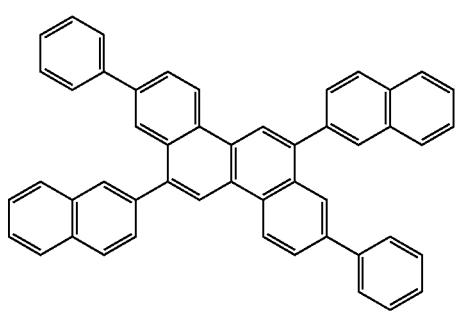
HB5 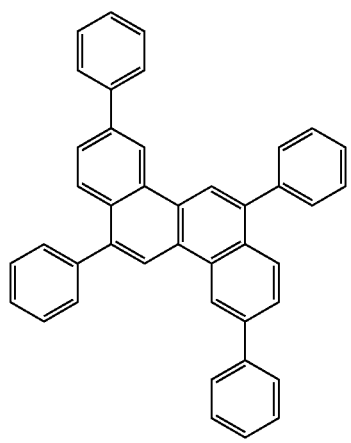 HB6 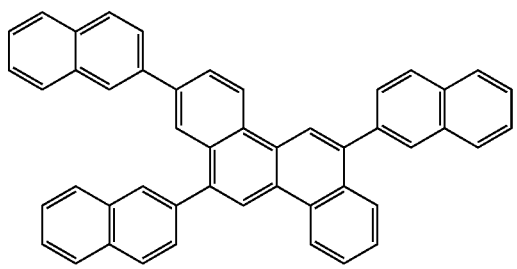
HB7 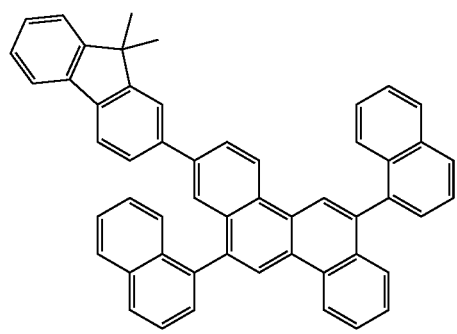 HB8 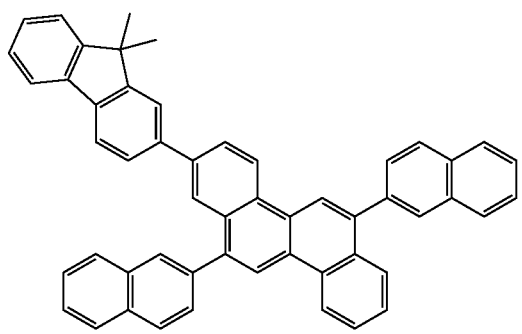

-continued
HB9
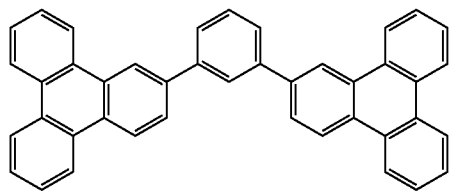
HB10
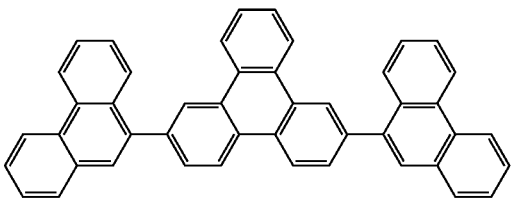
HB11
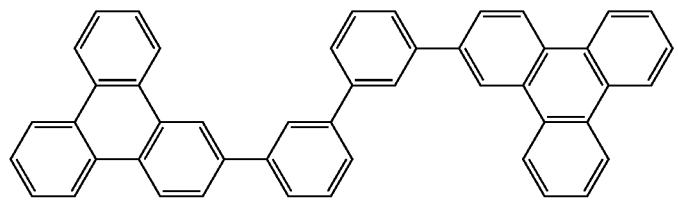
HB12
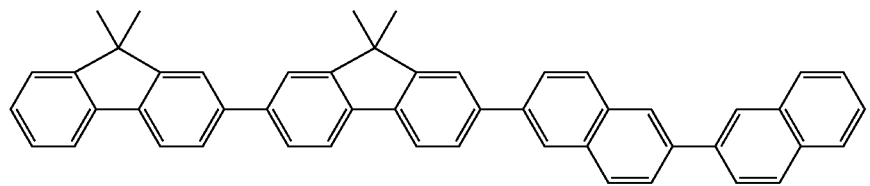
HB13
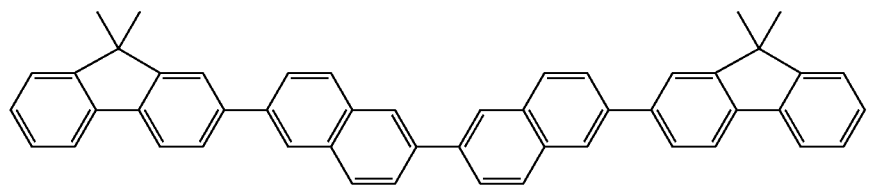
HB14
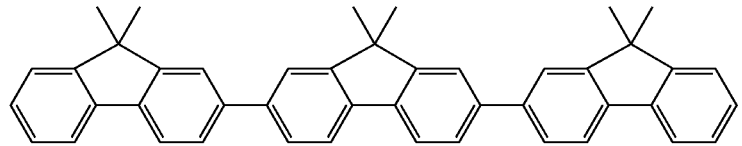
HB15
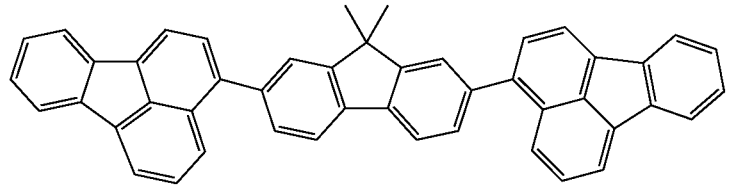
HB16
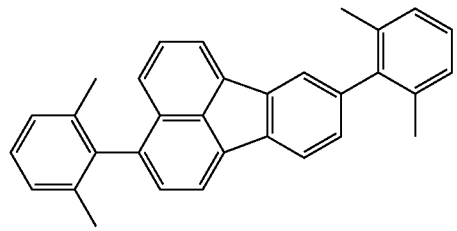
HB17
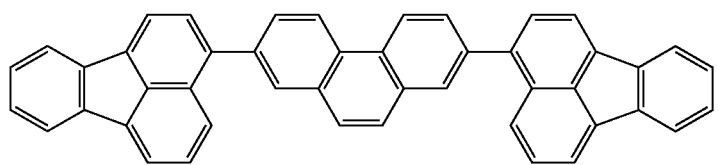

HB18
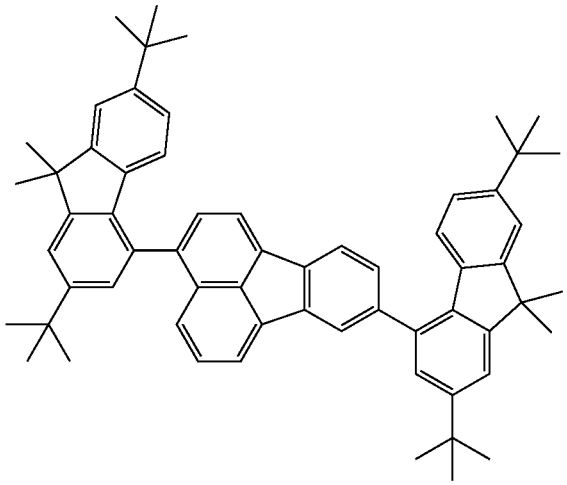

HB19
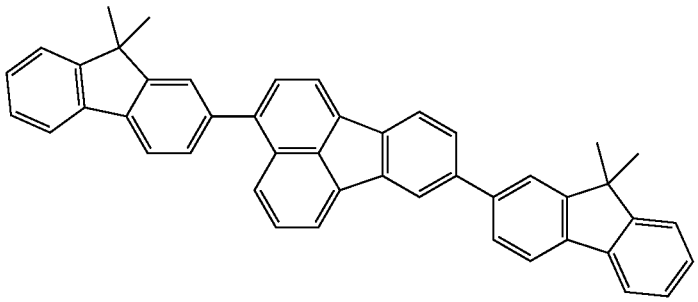

HB20
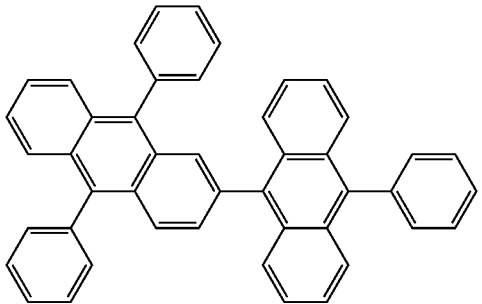

HB21
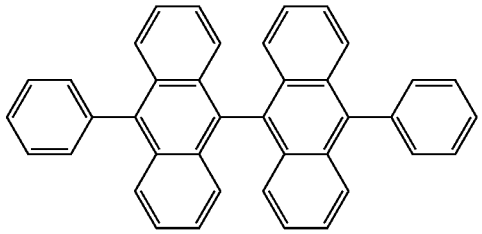

HB22
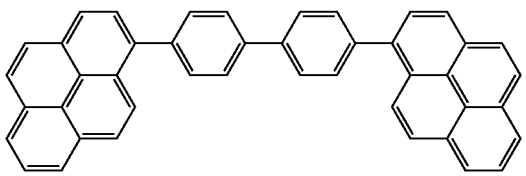

HB23
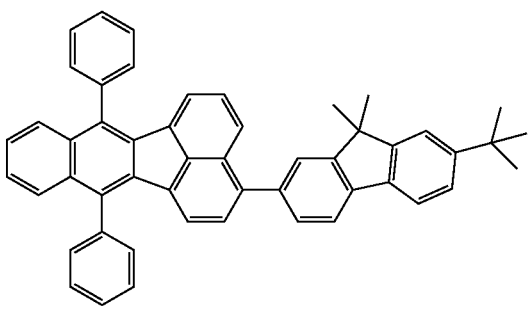

Among the hole-blocking layer materials illustrated, HB1 to HB14, each having a molecular structure constituted by an aromatic hydrocarbon ring selected from a benzene ring, a naphthalene ring, a fluorene ring, a benzofluorene ring, a phenanthrene ring, a chrysene ring, and a triphenylene ring, may be used because they have high S1 energies and high T1 energies as described above. This is because these hole-blocking layer materials can provide an organic EL element having high durability.

Specific examples of electron transport layer materials usable in the present disclosure are shown below. These compounds are given by way of illustration and not by way of limitation.

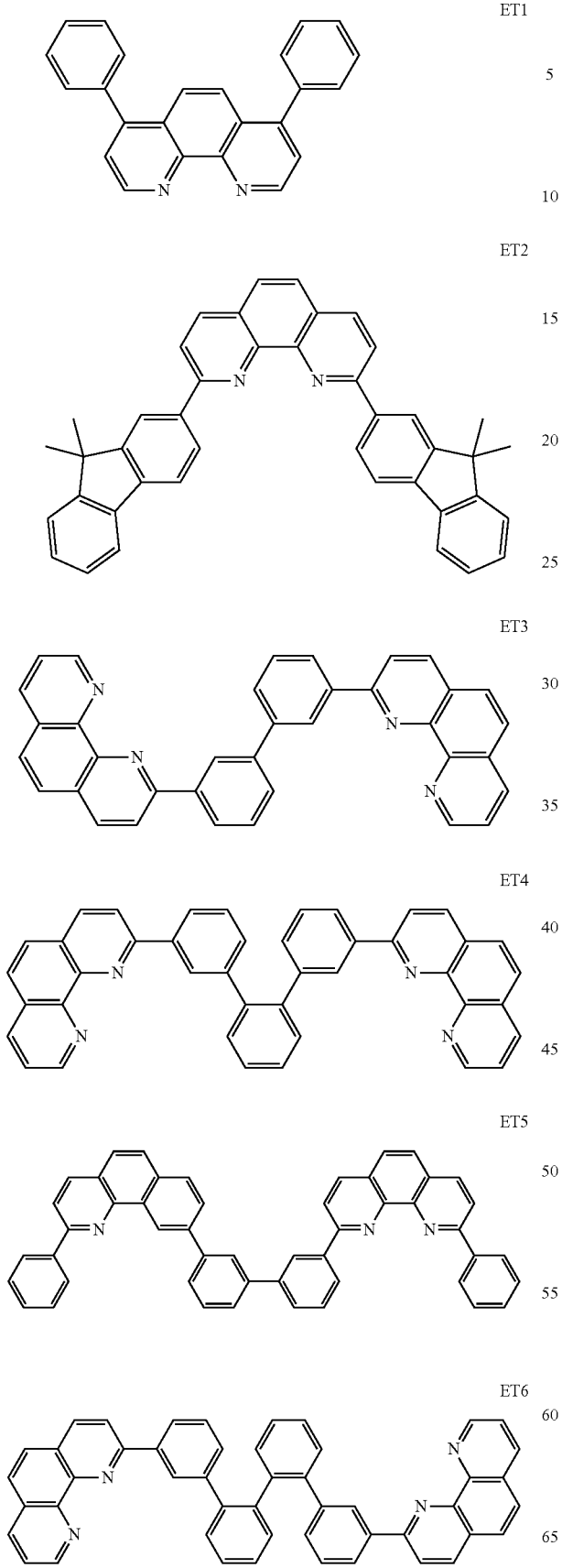
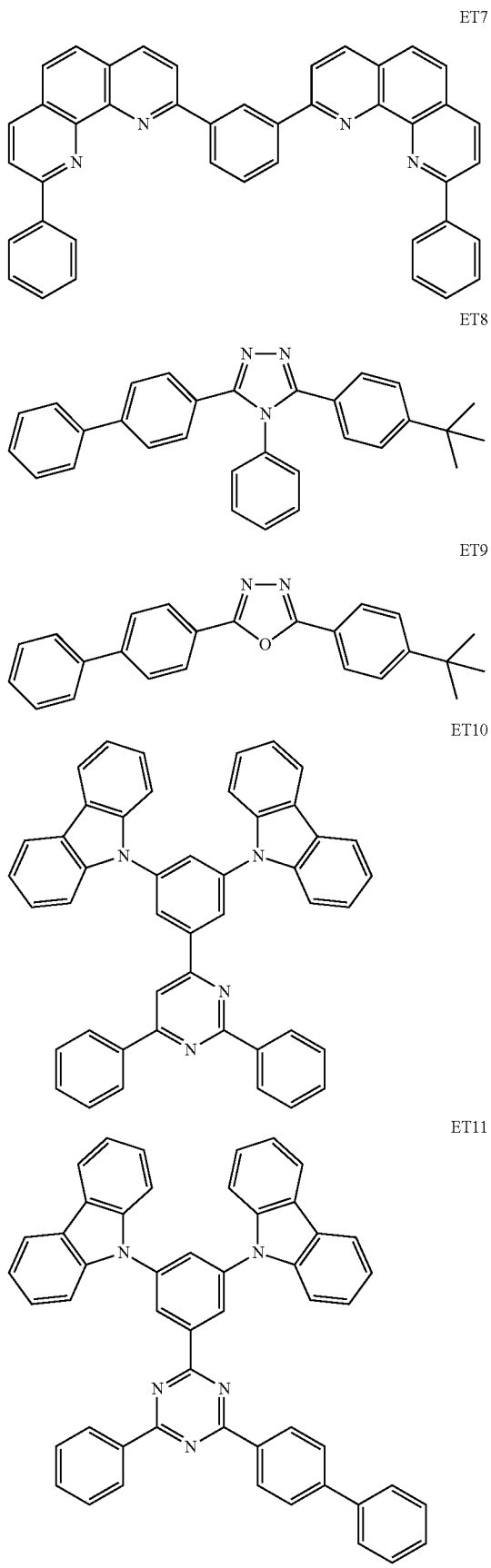

ET12
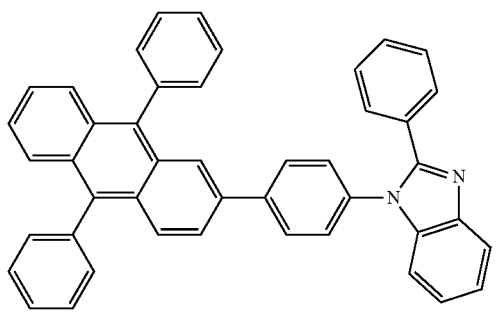

ET16
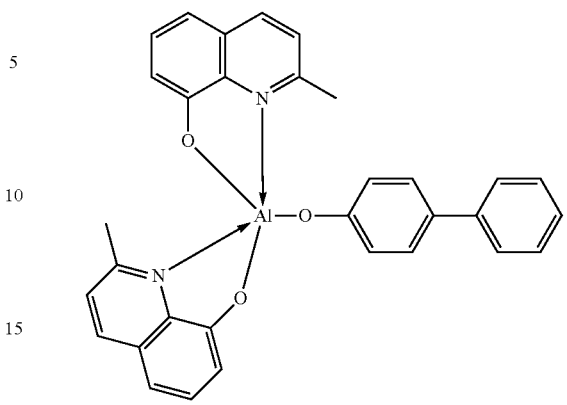

ET13
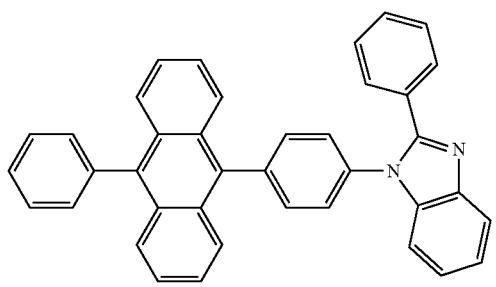

ET14
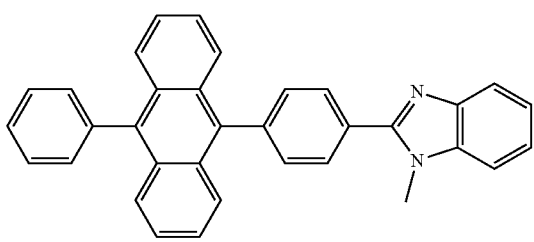

ET15
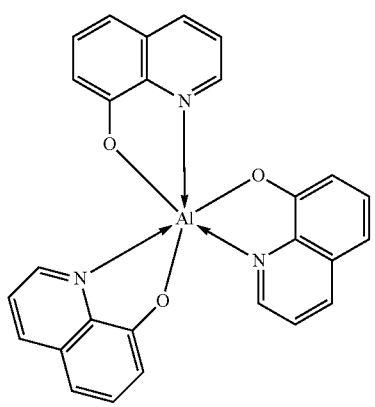

Structure of Organic EL Element

The organic EL element according to this embodiment is an organic electroluminescence element including a pair of electrodes and an organic compound layer disposed between the pair of electrodes. The organic compound layer has a layer structure of first light-emitting layer 4a (blue-light-emitting layer)/hole-blocking layer 5/electron transport layer 6.

Examples of structures of the organic EL element according to this embodiment include structures having the following organic compound layers on the substrate 1.

(1) Anode/hole transport layer/second light-emitting layer/first light-emitting layer/hole-blocking layer/electron transport layer/cathode (2) Anode/hole transport layer/second light-emitting layer/first light-emitting layer/hole-blocking layer/electron transport layer/electron injection layer/cathode (3) Anode/hole transport layer/third light-emitting layer/second light-emitting layer/first light-emitting layer/hole-blocking layer/electron transport layer/electron injection layer/cathode (4) Anode/hole injection layer/hole transport layer/second light-emitting layer/first light-emitting layer/hole-blocking layer/electron transport layer/electron injection layer/cathode (5) Anode/hole transport layer/electron-blocking layer/second light-emitting layer/first light-emitting layer/hole-blocking layer/electron transport layer/electron injection layer/cathode (6) Anode/hole injection layer/hole transport layer/electron-blocking layer/second light-emitting layer/first light-emitting layer/hole-blocking layer/electron transport layer/electron injection layer/cathode These exemplary element structures are merely basic ones, and the structure of the organic EL element according to the present disclosure is not limited thereto. Among these element structures, structures (2) to (6), which include an electron injection layer, are preferred, and structure (6), which includes both an electron-blocking layer and a hole-blocking layer, is more preferred. Structure (6) enables trapping of both carriers, that is, holes and electrons, in the light-emitting layers and thus can provide an EL element that undergoes no carrier leakage and emits light with high efficiency. Various other layer structures may be employed, for example: an insulating layer may be disposed at the interface between an electrode and an organic compound layer; an adhesive layer or an interference layer may be disposed; the electron transport layer or the hole transport layer may be formed of two layers having different ionization potentials; or the light-emitting layers may each be formed of two layers made of different luminescent materials.

The organic EL element according to this embodiment may be of bottom-emission type in which light is emitted from the electrode on the substrate side or of top-emission type in which light is emitted from the side opposite the substrate, or may be configured to emit light from both sides.

The light-emitting layers of the organic EL element according to this embodiment may each be composed of two or more components, which can be classified as a host material, which is the main component, and accessory components. The host material is a compound that exists as a matrix around guest materials in each light-emitting layer and that mainly have the functions of transporting carriers and donating excitation energy to a dopant material. The accessory components are compounds other than the main component. The accessory components may be referred to as a dopant material, an emission-assisting material, and a charge injection material. The dopant material is also referred to as a guest material. The emission-assisting material and the charge injection material may be organic compounds having the same structure or different structures. Although the emission-assisting material and the charge injection material are accessory components, they can also be referred to as a host material 2 to be distinguished from the dopant material.

The dopant material is a compound that plays a major role in light emission in each light-emitting layer. The concentration of the dopant material is 0.01 mass % or more and less than 50 mass %, preferably 0.1 mass % or more and 20 mass % or less, provided that the total amount of compounds constituting the light-emitting layer is 100 mass %. Still more preferably, the concentration of the dopant material is 10 mass % or less in order to reduce concentration quenching. The dopant material may be uniformly distributed throughout the layer made of the host material, may be distributed in the layer with a concentration gradient, or may be partially distributed in a particular region to provide a region of a host material layer not containing the dopant material.

The organic EL element according to this embodiment includes a plurality of light-emitting layers, and at least one of the plurality of light-emitting layers emits light with a wavelength different from those of light emitted from the other light-emitting layers. The organic EL element emits white light by blending the light from these light-emitting layers. In the present disclosure, two or more light-emitting layers are present, and each light-emitting layer may contain a luminescent material having two or more emission colors. When three or more light-emitting layers are stacked on top of each other, light-emitting layers other than the first light-emitting layer may be disposed in any manner; they may be in contact with the second light-emitting layer, or another compound layer may be disposed between the light-emitting layers. The other compound layer may be, for example, a charge generation layer.

In addition to the organic compounds described above, known low-molecular-weight and high-molecular-weight luminescent materials, hole-injecting or hole-transporting compounds, compounds serving as hosts, luminescent compounds, electron-injecting or electron-transporting compounds, and the like may optionally be used in combination. Examples of such compounds are described below.

As hole-injecting and hole-transporting materials, materials that facilitate injection of holes from the anode and materials having so high hole mobility that enables injected holes to be transported to the light-emitting layers may be used. To prevent deterioration of film quality, such as crystallization, in the organic EL element, materials having high glass-transition temperatures may be used. Examples of low-molecular-weight and high-molecular-weight materials having hole-injecting and hole-transporting properties include triarylamine derivatives, arylcarbazole derivatives, phenylenediamine derivatives, stilbene derivatives, phthalocyanine derivatives, porphyrin derivatives, poly(vinylcarbazole), poly(thiophene), and other conductive polymers. These hole-injecting and hole-transporting materials are also suitable for use in the electron-blocking layer.

Specific examples of compounds usable as hole-injecting and hole-transporting materials are shown below, but these are, of course, non-limiting examples.

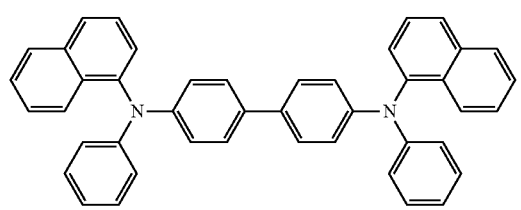

HT1

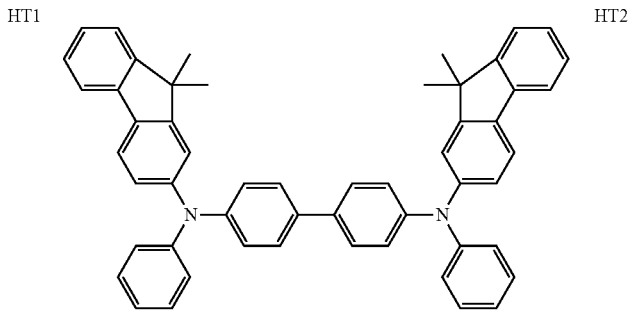

HT2

-continued
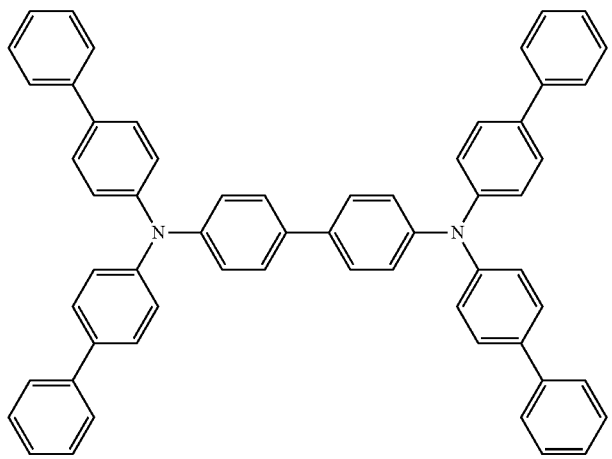
HT3
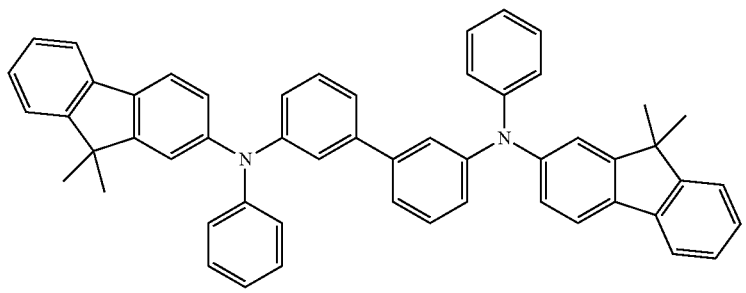
HT4
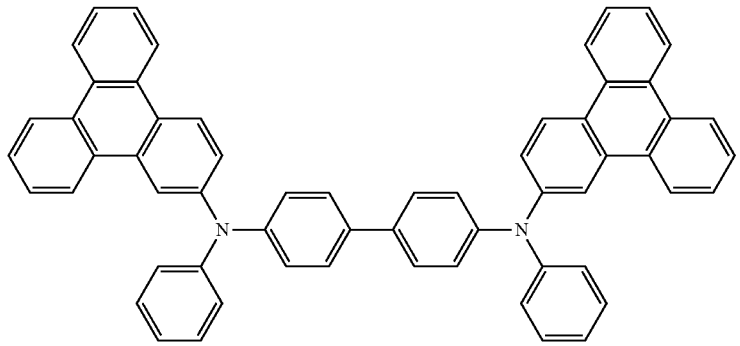
HT5
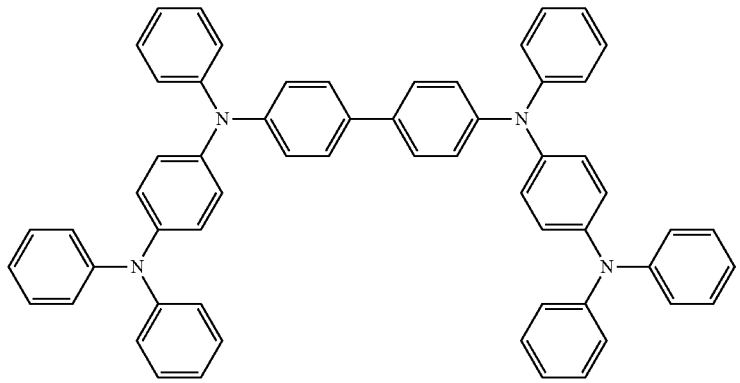
HT6

-continued
HT7
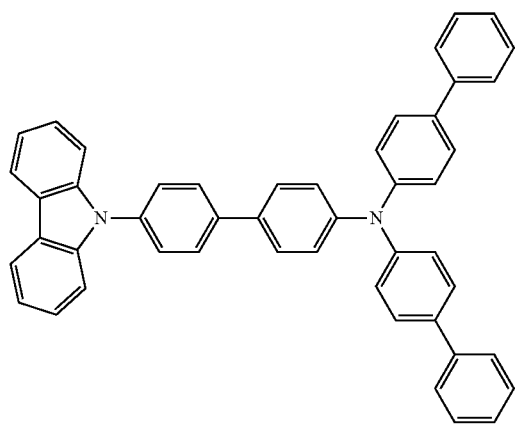
HT8
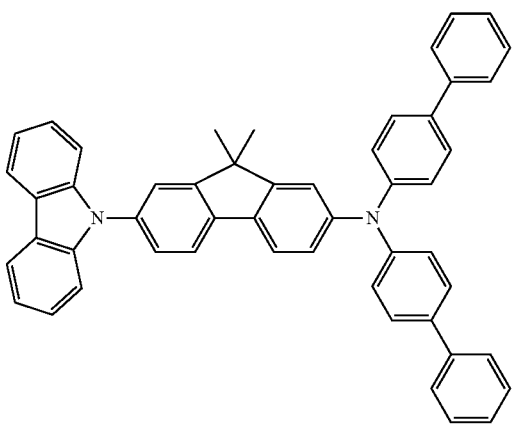
HT9
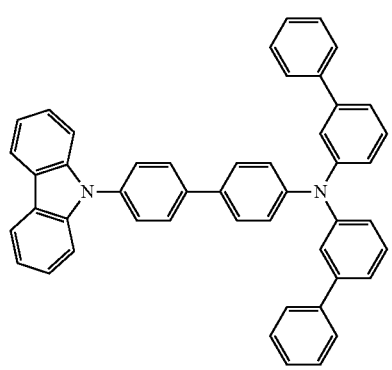
HT10
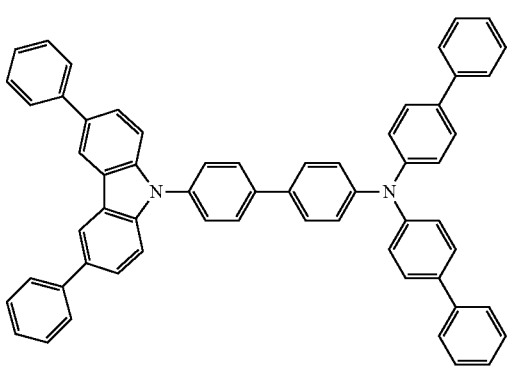
HT11
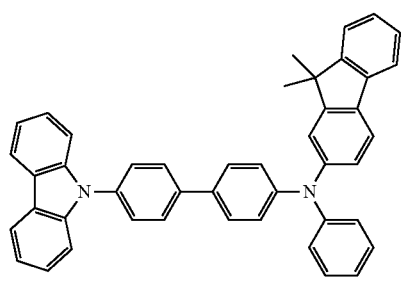
HT12
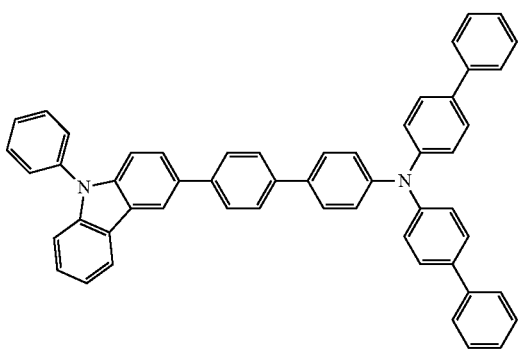
HT13
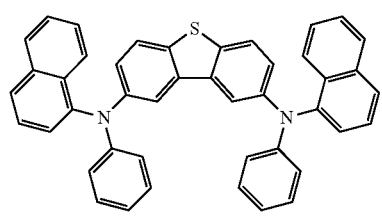
HT14
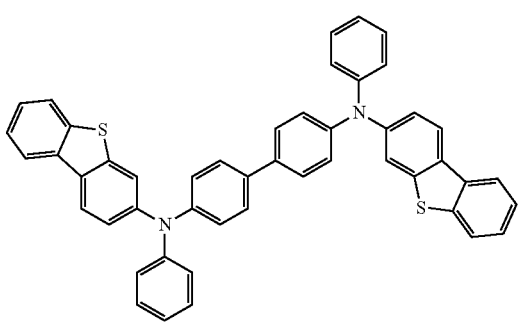

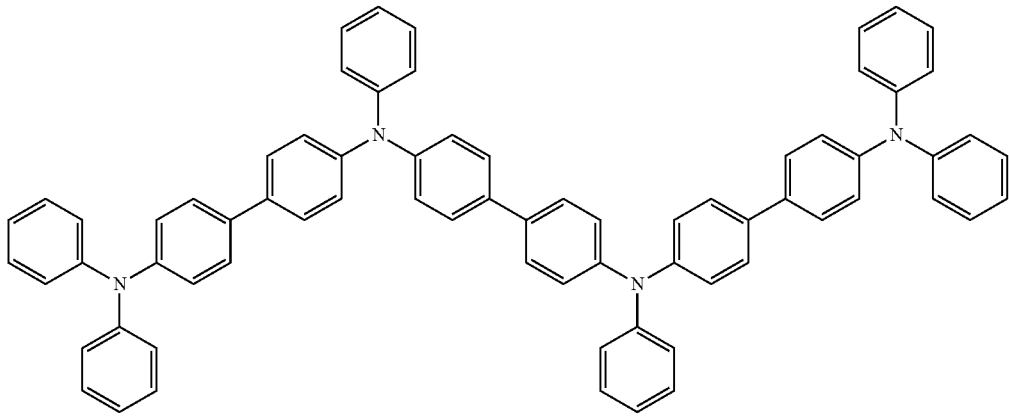

HT15

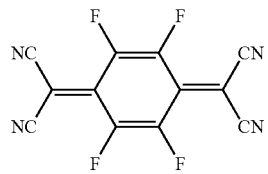

HT16

HT17

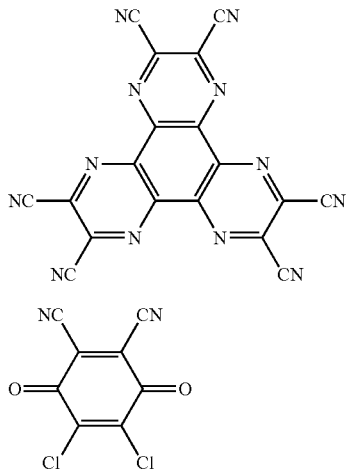

HT18

Examples of luminescent materials mainly contributing to the light-emitting function include the blue dopants, green dopants, and red dopants described above, fused-ring compounds (e.g., fluorene derivatives, naphthalene derivatives, pyrene derivatives, perylene derivatives, tetracene derivatives, anthracene derivatives, and rubrene), quinacridone derivatives, coumarin derivatives, stilbene derivatives, organic aluminum complexes such as tris(8-quinolinolato) aluminum, iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives.

Examples of host materials and emission-assisting materials in the light-emitting layers include the above-described compounds and derivatives thereof, carbazole derivatives, dibenzofuran derivatives, dibenzothiophene derivatives, organic aluminum complexes such as tris(8-quinolinolato) aluminum, and organic beryllium complexes.

Any electron-transporting material capable of transporting electrons injected from the cathode to the light-emitting layers can be freely selected taking into account, for example, the balance with the hole mobility of a hole-transporting material. Examples of materials capable of transporting electrons include the above-described compounds and derivatives thereof, oxadiazole derivatives, oxazole derivatives, pyrazine derivatives, triazole derivatives, triazine derivatives, quinoline derivatives, quinoxaline derivatives, phenanthroline derivatives, organic aluminum complexes, and fused-ring compounds (e.g., fluorene derivatives, naphthalene derivatives, chrysene derivatives, and anthracene derivatives).

The substrate 1 may be made of any material such as quartz, glass, silicon wafers, resins, and metals. The substrate 1 may have lines and switching elements such as transistors disposed thereon, and an insulating layer may be disposed thereon. The insulating layer may be any layer through which a contact hole can be formed in order to provide an electrical connection between the anode 2 and a line and which also provides insulation for an unconnected line. For example, resins such as polyimide, silicon oxide, and silicon nitride can be used.

The anode 2 may be made of a material having as high a work function as possible. For example, metals such as gold, platinum, silver, copper, nickel, palladium, cobalt, selenium, vanadium, and tungsten, mixtures containing these metals, alloys of these metals, and metal oxides such as tin oxide, zinc oxide, indium oxide, indium tin oxide (ITO), and indium zinc oxide can be used. Conductive polymers such as polyaniline, polypyrrole, and polythiophene can also be used. These electrode materials can be used alone or in combination. The anode 2 may be formed of a single layer or multiple layers. When the anode 2 is used as a reflection electrode, chromium, aluminum, silver, titanium, tungsten, molybdenum, an alloy thereof, or a laminate thereof can be used, for example. When the anode 2 is used as a transparent electrode, a transparent conductive oxide layer of, for example, indium tin oxide (ITO) or indium zinc oxide can be used, but these are not limiting examples. Photolithography can be used for electrode formation.

The cathode 7 may be made of a material having as low a work function as possible. Examples of such materials include alkali metals such as lithium; alkaline earth metals such as calcium; metals such as aluminum, titanium, manganese, silver, lead, and chromium; and mixtures containing these metals. Alloys of these metals can also be used. For example, magnesium-silver, aluminum-lithium, aluminum-magnesium, silver-copper, and zinc-silver can be used. Metal oxides such as indium tin oxide (ITO) can also be used. These electrode materials can be used alone or in combination. The cathode may be formed of a single layer or multiple layers. The cathode 7 may be a conductive oxide layer such as ITO so as to provide a top-emission element or may be a reflection electrode such as aluminum (Al) so as to provide a bottom-emission element. The cathode 7 may be formed by any method, but, for example, DC and AC sputtering processes may be used because these methods provide good film coverage and are likely to reduce resistance.

After the cathode 7 is formed, a sealing member (not illustrated) may be disposed. For example, bonding a glass plate provided with a moisture absorbent to the cathode 7 can prevent permeation of water into the organic compound layers, thus preventing the occurrence of a display failure. In another embodiment, a passivation film made of, for example, silicon nitride may be disposed on the cathode 7 to prevent permeation of water into the organic compound layers. For example, a sealing film may be formed in such a manner that the cathode 7, after being formed, is conveyed to another chamber without breaking the vacuum, and a silicon nitride film having a thickness of 2 μm is formed thereon by CVD.

Color filters may be disposed on pixels. For example, color filters sized to fit pixels may be disposed on another substrate and bonded to a substrate provided with the organic EL element. Alternatively, color filters may be patterned on a sealing film of, for example, silicon oxide by photolithography.

The organic compound layers (e.g., the hole injection layer, the hole transport layer, the electron-blocking layer, the light-emitting layers, the hole-blocking layer, the electron transport layer, and the electron injection layer) constituting the organic EL element according to this embodiment are formed by the following method.

The organic compound layers constituting the organic EL element according to this embodiment can each be formed using a dry process such as vacuum deposition, ionized deposition, sputtering, or plasma deposition. Alternatively, the organic compound layers can each be formed using a wet process by applying a solution of an organic compound in an appropriate solvent by a known coating method (e.g., spin coating, dipping, casting, the LB technique, or ink-jet coating). Layers formed by vacuum deposition or solution coating are unlikely to undergo deterioration such as crystallization and are highly stable over time. When a coating method is used, an appropriate binder resin can be used in combination to form a film.

Examples of binder resins include, but are not limited to, polyvinylcarbazole resins, polycarbonate resins, polyester resins, ABS resins, acrylic resins, polyimide resins, phenol resins, epoxy resins, silicone resins, and urea resins. These binder resins may be used alone as a homopolymer or copolymer or may be used as a mixture of two or more. In addition, known additives such as plasticizers, antioxidants, and UV absorbers may optionally be used in combination.

Devices Including White Organic EL Element

The white organic EL element according to this embodiment can be used as a component of a display device or a lighting device. Other applications include an exposure light source in an electrophotographic image-forming apparatus, a backlight in a liquid crystal display device, and a light-emitting device including a white light source with a color filter. The color filter may be, for example, a filter that allows red, green, or blue light to pass therethrough.

A display device according to an embodiment includes a plurality of pixels, and at least one of the pixels includes the organic EL element according to this embodiment. The at least one pixel includes the organic EL element according to this embodiment and an active element. The active element may be, for example, a switching element or an amplifying element, specifically, a transistor. The anode or cathode of the organic EL element is electrically connected to a drain or source electrode of the transistor. The transistor may contain an oxide semiconductor in its active region. The oxide semiconductor may be amorphous, crystalline, or an amorphous-crystalline mixture. If being crystalline, the oxide semiconductor may be monocrystalline, microcrystalline, in a crystalline state in which the C axis or any other particular axis is oriented, or in a mixed crystalline state of two or more of these states.

An organic light-emitting device including such a switching element may be used as an image display device in which each organic EL element is a pixel or as a lighting device. The organic light-emitting device may also be used as an exposure light source for exposing a photoconductor in an electrophotographic image-forming apparatus such as a laser beam printer or a copier.

The display device can be used as an image display device for, for example, a PC. An example of the above-described transistor is a TFT element, and the TFT element is disposed, for example, on an insulating surface of a substrate. The display device may be an image information processing device including an image input unit configured to receive image information from, for example, an area CCD, a linear CCD, and a memory card, an information-processing unit configured to process the input information, and a display unit configured to display the input image. The display unit of an image capture apparatus or an ink-jet printer may have a touch panel function. The touch panel function may be activated by any system, such as an infrared system, an electrostatic capacitive system, a resistive film system, or an electromagnetic induction system. The display device may also be used in a display unit of a multifunctional printer.

The lighting device is, for example, an indoor lighting device. The lighting device may emit light of cool white (color temperature: 4200 K), day white (color temperature: 5000 K), or any other color from blue to red. At least one of the organic EL elements of the lighting device is the organic EL element of the present disclosure. The lighting device according to this embodiment includes the organic EL element according to this embodiment and an AC/DC converter connected to the organic EL element. The AC/DC converter is a circuit that converts AC voltage to DC voltage. The converter is a circuit for supplying drive voltage to the organic EL element. The lighting device may further include a color filter. The lighting device according to this embodiment may also include a heat dissipation unit. The heat dissipation unit is configured to dissipate heat out of the device and may be made of, for example, a metal of high specific heat or liquid silicon.

An image-forming apparatus according to this embodiment includes a photoconductor, an exposure unit configured to expose the photoconductor, a charging unit configured to charge the photoconductor, and a developing unit configured to apply a developer to the photoconductor. The exposure unit of the image-forming apparatus includes the multiple organic EL elements of the present disclosure. The developer is, for example, a toner or an ink. The toner may be a dry toner or a liquid toner.

The organic EL element according to this embodiment can be used as a component of an exposure device that exposes a photoconductor. An exposure device including the organic EL element according to this embodiment has, for example, multiple light-emitting points, and at least one of the light-emitting points includes the organic EL element according to this embodiment. These light-emitting points are aligned along the longitudinal direction of the photoconductor.

The organic EL element according to this embodiment has an emission luminance that is controlled by a TFT, which is an example of a switching element. Disposing the multiple organic EL elements in a screen enables a display of an image with different emission luminances. The switching element according to this embodiment need not necessarily be a TFT and may be a transistor, an MIM element, or an active matrix driver formed on a substrate such as a Si substrate. The active matrix driver may also be formed in the substrate. This is selected according to the level of resolution. For example, in the case of 1-inch size and about a QVGA resolution, the organic EL element may be disposed on a Si substrate. Driving the display device including the organic EL element according to this embodiment enables a stable display with high image quality over a long period of time.

The display device and the lighting device including the organic EL element of the present disclosure can be stably used with high image quality over a long period of time.

Display Device

Figure 3:
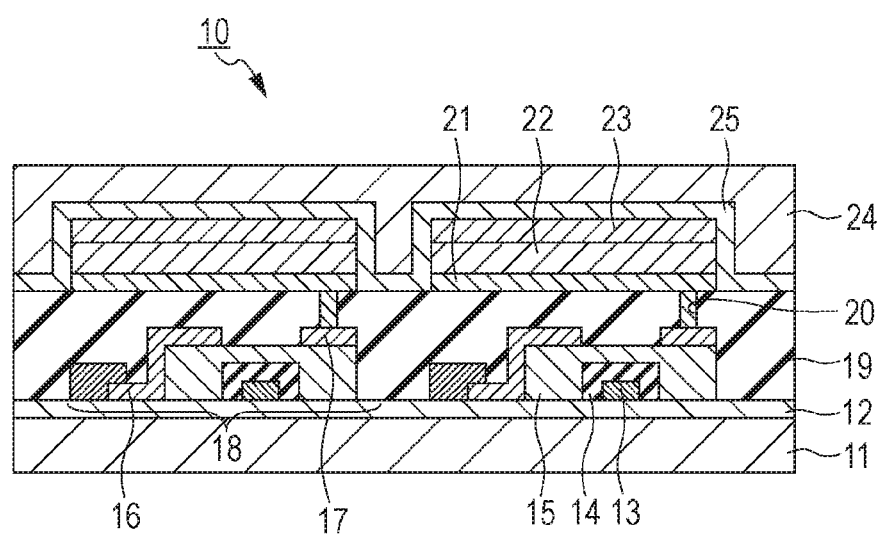
FIG. 3 is a schematic sectional view illustrating a display device according to an exemplary embodiment.

FIG. 3 is a schematic sectional view illustrating a display device according to an exemplary embodiment and illustrates an exemplary display device including an organic EL element and a TFT element connected to the organic EL element. The TFT element is an example of an active element. The display device according to this embodiment may include red, green, and blue color filters. The red, green, and blue color filters may be disposed in a delta arrangement.

A display device 10 in FIG. 3 includes a substrate 11 made of, for example, glass and a moisture-proof film 12 thereon for protecting a TFT element 18 or an organic compound layer 22. The TFT element 18 includes a gate electrode 13 made of metal, a gate insulating film 14, a semiconductor layer 15, a drain electrode 16, and a source electrode 17. An insulating film 19 is disposed on the TFT element 18. An anode 21 constituting an organic EL element and the source electrode 17 are connected to each other through a contact hole 20. The electrodes (the anode 21 and a cathode 23) in the organic EL element and the electrodes (the source electrode 17 and the drain electrode 16) in the TFT need not necessarily be electrically connected to each other in the manner illustrated in FIG. 3. It is only required that either the anode 21 or the cathode 23 be electrically connected to either the source electrode 17 or the drain electrode 16 in the TFT element. Although the organic compound layer 22 is illustrated as a single layer in the display device 10 in FIG. 3, the organic compound layer 22 may be composed of multiple layers. A first protective layer 24 and a second protective layer 25 for preventing deterioration of the organic EL element are disposed over the cathode 23.

Although a transistor is used as a switching element in the display device 10 in FIG. 3, an MIM element may be used as a switching element instead. The transistor used in the display device 10 in FIG. 3 may not only be a transistor obtained using a single-crystal silicon wafer but also a thin-film transistor including a substrate and an active layer on an insulating surface of the substrate. The active layer may be made of, for example, single-crystal silicon, non-single-crystal silicon such as amorphous silicon or microcrystalline silicon, or a non-single-crystal oxide semiconductor such as indium zinc oxide or indium gallium zinc oxide. The thin-film transistor is also referred to as a TFT element. The transistor in the display device 10 in FIG. 3 may be formed in a substrate such as a Si substrate. The phrase "formed in a substrate" means producing a transistor by processing a substrate itself, such as a Si substrate. That is, having a transistor in a substrate can also mean that a substrate and a transistor are integral with each other. Whether the transistor is provided in a substrate is selected according to the level of resolution. For example, in the case of 1-inch size and about a QVGA resolution, the transistor may be disposed in a Si substrate.

Figure 4:
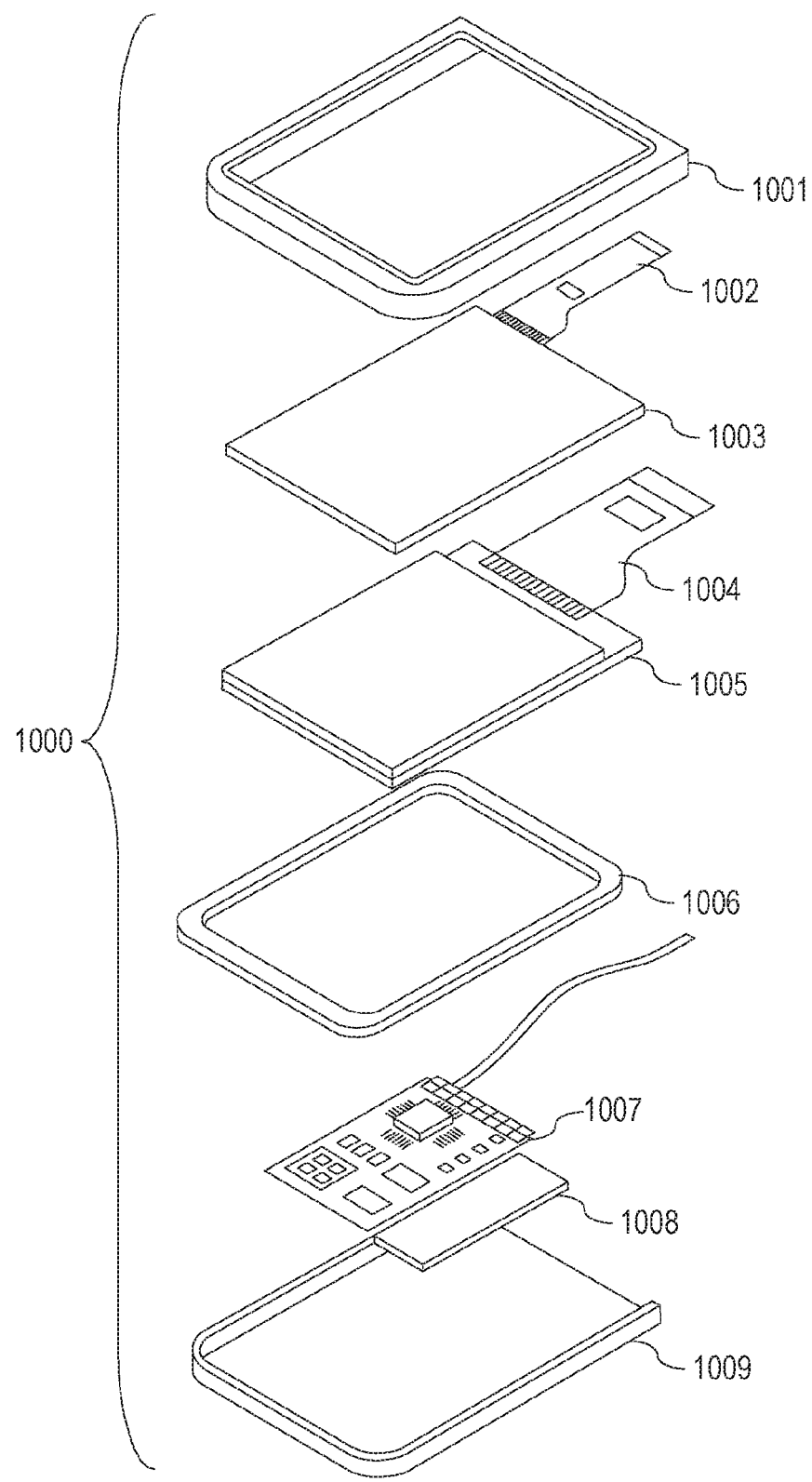
FIG. 4 is a schematic view illustrating a display device according to an exemplary embodiment.

FIG. 4 is a schematic view illustrating a display device according to an exemplary embodiment. A display device 1000 may include an upper cover 1001, a lower cover 1009, and a touch panel 1003, a display panel 1005, a frame 1006, a circuit board 1007, and a battery 1008 disposed between the upper cover 1001 and the lower cover 1009. Flexible print circuits (FPCs) 1002 and 1004 are connected to the touch panel 1003 and the display panel 1005, respectively. The organic light-emitting element according to this embodiment may be used in the display panel 1005. A transistor is printed on the circuit board 1007. The battery 1008 may be omitted if the display device is not a mobile device. If the display device is a mobile device, the battery 1008 need not necessarily be disposed at this position.

Figure 5A:
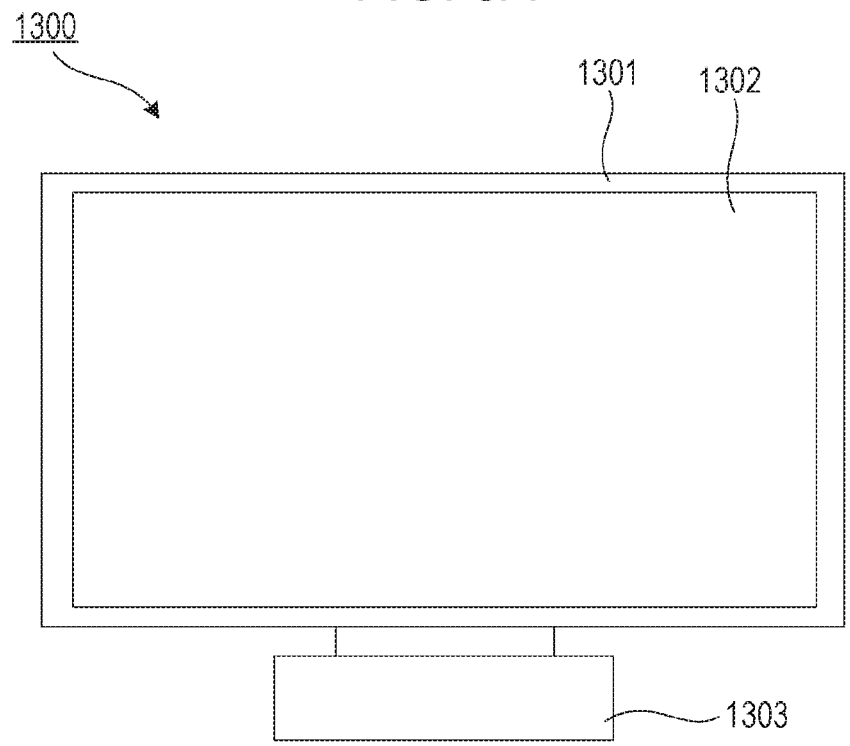
FIGS. 5A and 5B are schematic views illustrating display devices according to exemplary embodiments.
Figure 5B:
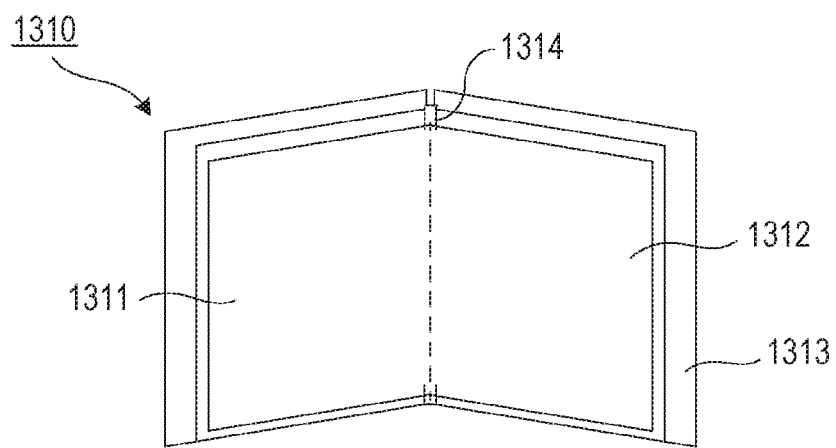

FIGS. 5A and 5B are schematic views illustrating display devices according to exemplary embodiments. FIG. 5A illustrates a display device, for example, a television monitor or a PC monitor. A display device 1300 includes a frame 1301 and a display unit 1302. The organic EL element according to this embodiment may be used in the display unit 1302. The display device 1300 includes a base 1303 that supports the frame 1301 and the display unit 1302. The base 1303 need not necessarily be in the form illustrated in FIG. 5A. The lower side of the frame 1301 may serve as a base. The frame 1301 and the display unit 1302 may be curved. The radius of curvature may be 5000 mm or more and 6000 mm or less. A display device 1310 in FIG. 5B is configured to be folded and what is called a foldable display device. The display device 1310 includes a first display unit 1311, a second display unit 1312, a housing 1313, and a bending point 1314. The first display unit 1311 and the second display unit 1312 may each include the organic EL element according to this embodiment. The first display unit 1311 and the second display unit 1312 may be a seamless, monolithic display device. The first display unit 1311 and the second display unit 1312 can be divided by the bending point. The first display unit 1311 and the second display unit 1312 may display different images, or the first and second display units may together display a single image.

Image Capture Apparatus

The display device according to this embodiment may be used in a display unit of an image capture apparatus that includes an optical unit including a plurality of lenses and an image capture element configured to receive light that has passed through the optical unit. The image capture apparatus may include a display unit configured to display information acquired by the image capture element. The display unit may be exposed to the outside of the image capture apparatus or disposed in a viewfinder. The image capture apparatus may be a digital camera or a digital camcorder.

Figure 6:
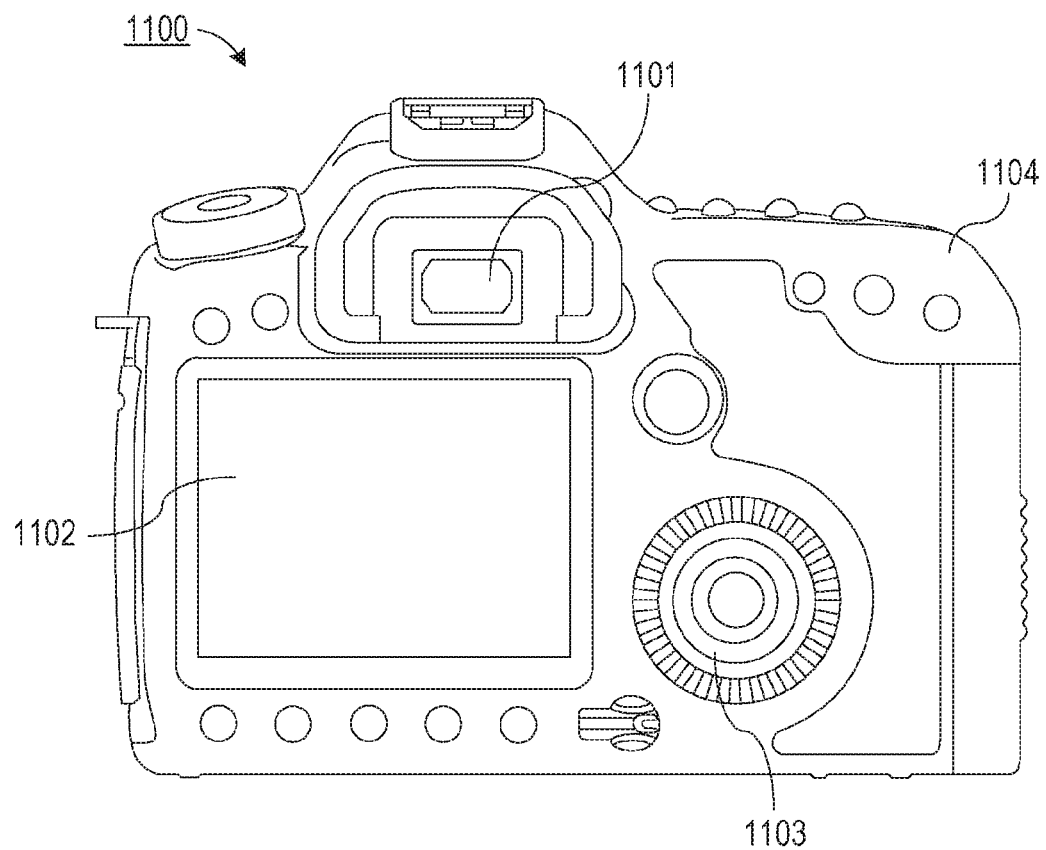
FIG. 6 is a schematic view illustrating an image capture apparatus according to an exemplary embodiment.

FIG. 6 is a schematic view illustrating an image capture apparatus according to an exemplary embodiment. An image capture apparatus 1100 may include a viewfinder 1101, a rear display 1102, an operation unit 1103, and a housing 1104. The viewfinder 1101 may include the display device according to this embodiment. In this case, the display device may display not only an image to be captured but also environmental information, image capture instructions, and the like. The environmental information may be, for example, the intensity of external light, the direction of external light, the moving speed of a subject, and the possibility that the subject is hidden by an object. Since the timing appropriate for capturing an image is only a moment, the information is desirably displayed as quickly as possible. Thus, the display device including the organic EL element of the present disclosure can be used. This is because the organic EL element has a high response speed. The display device including the organic EL element is more suitable for use as a device required to have a high display speed than liquid crystal display devices. The image capture apparatus 1100 includes an optical unit (not illustrated). The optical unit includes a plurality of lenses and focuses an image on the image capture element accommodated in the housing 1104. By adjusting the relative positions of the plurality of lenses, the focal point can be adjusted. This operation can also be performed automatically.

Electronic Device

The display device according to this embodiment may be used in a display unit of an electronic device such as a mobile terminal. In this case, the display device may have both a display function and an operating function. Examples of mobile terminals include cellular phones such as smart phones, tablets, and head mount displays.

Figure 7:
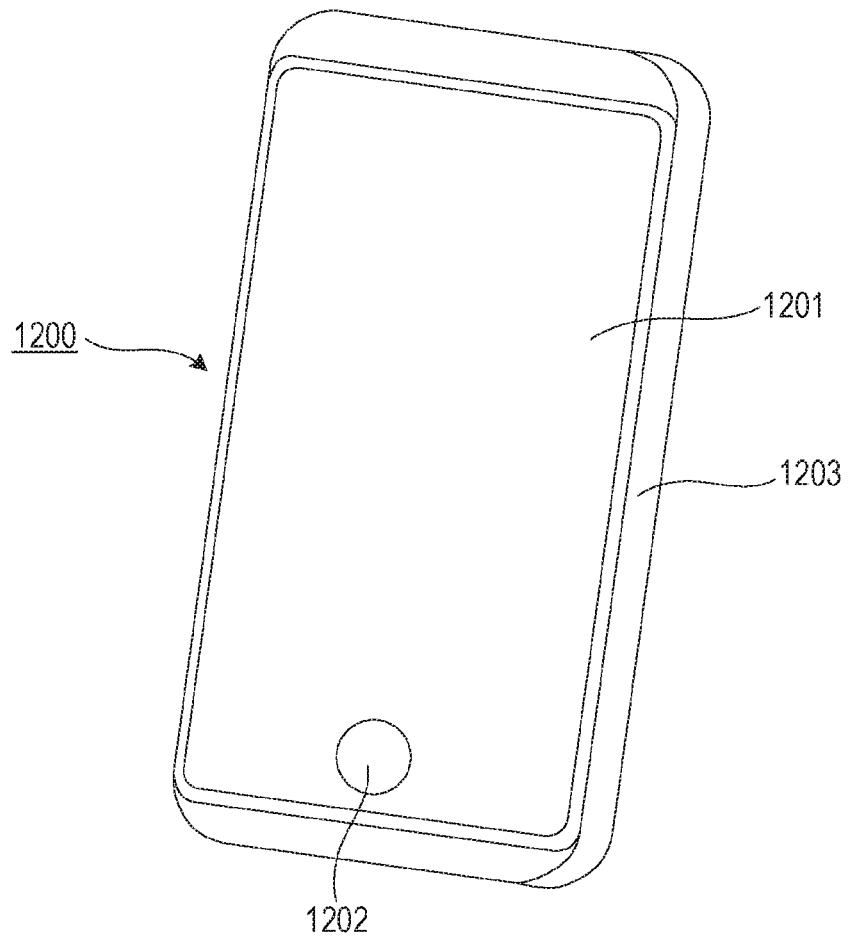
FIG. 7 is a schematic view illustrating a mobile device according to an exemplary embodiment.

FIG. 7 is a schematic view illustrating a mobile device according to an exemplary embodiment. A mobile device 1200 includes a display unit 1201, an operation unit 1202, and a housing 1203. The housing 1203 may include a circuit, a printed board including the circuit, a battery, and a communication unit. The operation unit 1202 may be a button or a touch-sensitive response unit. The operation unit may be a biometric recognition unit that, for example, releases a lock through recognition of fingerprints. A mobile device including a communication unit can also be referred to as a communication device.

Lighting Device

Figure 8:
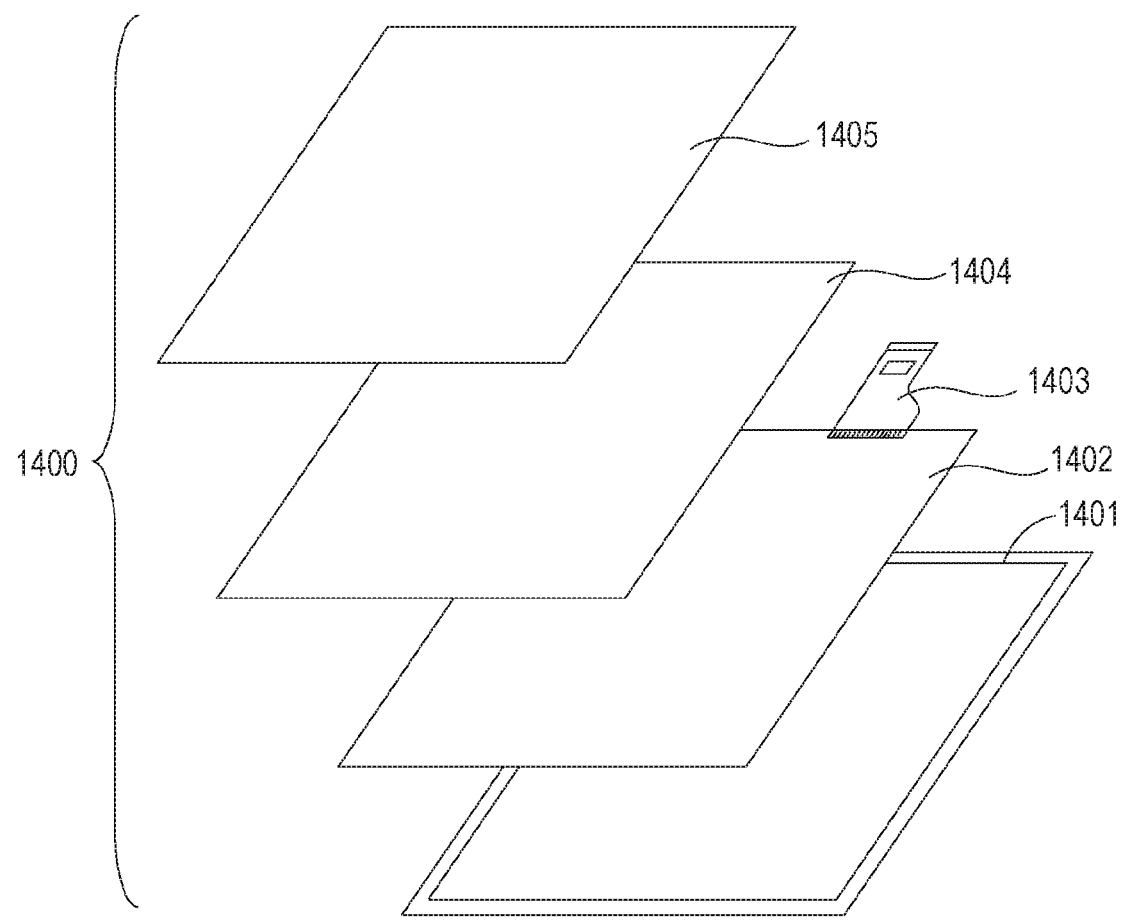
FIG. 8 is a schematic view illustrating a lighting device according to an exemplary embodiment.

FIG. 8 is a schematic view illustrating a lighting device according to an exemplary embodiment. A lighting device 1400 may include a housing 1401, a light source 1402, a circuit board 1403, an optical filter 1404, and a light diffusion unit 1405. The light source 1402 may include the organic EL element according to this embodiment. The optical filter 1404 may be a filter for improving the color rendering properties of the light source 1402. The light diffusion unit 1405 effectively diffuses light from the light source 1402 and helps the light reach a wide region for, for example, lighting up. Optionally, a cover may be disposed at an outermost portion.

The lighting device is, for example, an indoor lighting device. The lighting device may emit light of cool white, day white, or any other color from blue to red. The lighting device may include a modulation circuit configured to modulate the light. The lighting device may include the organic EL element of the present disclosure and a power supply circuit connected thereto. The power supply circuit is a circuit that converts AC voltage to DC voltage. Cool white has a color temperature of 4200 K, and day white has a color temperature of 5000 K. The lighting device may include a color filter.

The lighting device according to this embodiment may also include a heat dissipation unit. The heat dissipation unit is configured to dissipate heat out of the device and may be made of, for example, a metal of high specific heat or liquid silicon.

Moving Object

Figure 9:
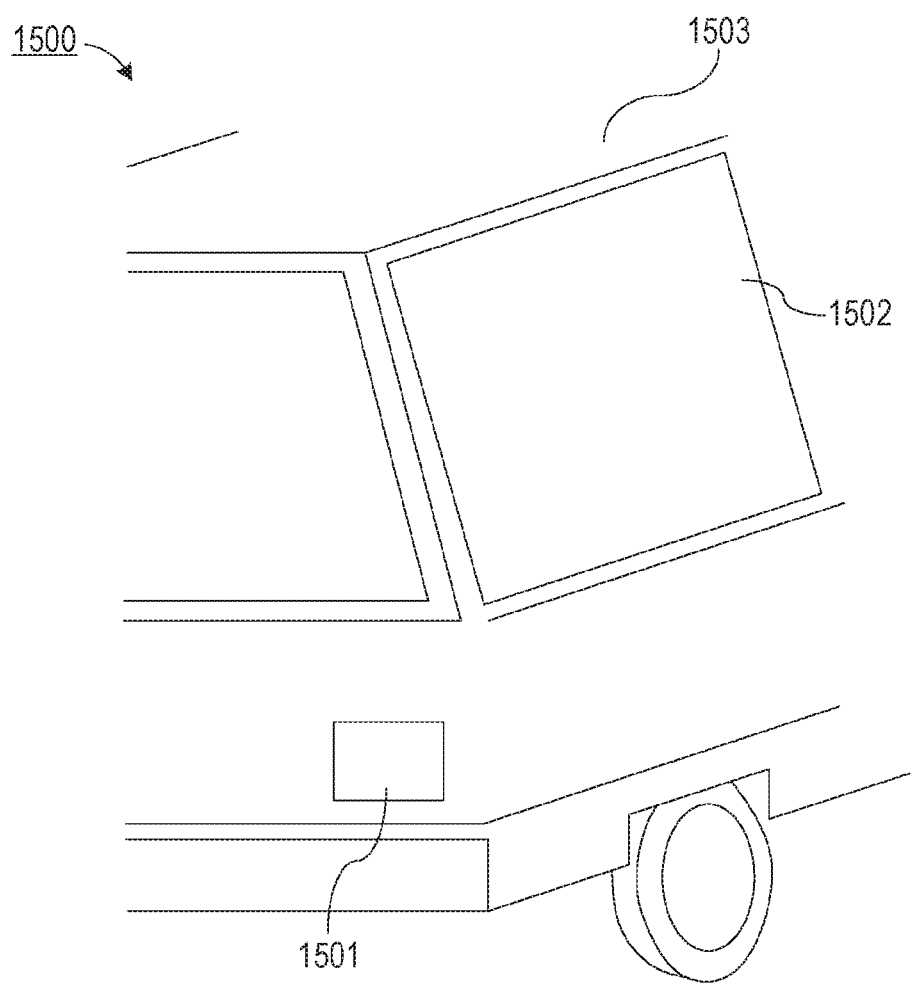
FIG. 9 is a schematic view illustrating a moving object according to an exemplary embodiment.

A moving object according to an embodiment includes a body and a lighting fixture mounted to the body. FIG. 9 is a schematic view illustrating an example of the moving object according to this embodiment and illustrates an automobile including a tail lamp, which is an example of a vehicle lighting fixture. An automobile 1500, which is an example of a moving object, includes a tail lamp 1501, and the tail lamp 1501 may be configured to be turned on in response to, for example, brake operation. The tail lamp 1501 may include the organic EL element according to this embodiment. The tail lamp 1501 may include a protective member that protects the organic EL element. The protective member may be made of any material that is strong to some extent and transparent, preferably a polycarbonate or the like. A mixture of a polycarbonate and, for example, a furandicarboxylic acid derivative or an acrylonitrile derivative may be used. The automobile 1500 may include a car body 1503 and a window 1502 attached thereto. The window 1502 may be a transparent display unless it is a window for checking the front and rear of the automobile 1500. The transparent display may include the organic EL element according to this embodiment. In this case, components, such as electrodes, of the organic EL element are made of transparent materials.

EXAMPLES

Evaluations of HOMO and LUMO

Hosts and dopants were evaluated as described below. The results are shown in Table 2.

A) Method of evaluating HOMO

A 30-nm-thick thin film was formed on an aluminum substrate, and the HOMO of the thin film was measured using an AC-3 (manufactured by RIKEN KEIKI Co., Ltd).

B) Method of evaluating LUMO

A 30-nm-thick thin film was formed on a quartz substrate, and using the thin film as a target material, its optical band gap (absorption edges) was determined with a spectrophotometer (V-560 manufactured by JASCO Corporation). The optical band gap value was added to the above HOMO value to determine LUMO. The results are shown in Table 2. Table 2 also shows calculated values obtained by molecular orbital calculation. Comparisons between the calculated values and the measured values show that HOMO and LUMO energies are correlated with each other. Thus, in the following EXAMPLES, HOMO and LUMO energy values determined from the calculated values are used to discuss the results of elements.

TABLE 2

|  | Compound | HOMO (eV) Measured value | LUMO (eV) Measured value | HOMO (eV) Calculated value | LUMO (eV) Calculated value |
|---|---|---|---|---|---|
| Host | EM1 | −6.02 | −3.10 | −5.11 | −1.67 |
|  | EM2 | −5.96 | −3.04 | −5.06 | −1.62 |
|  | EM3 | −5.94 | −2.95 | −5.14 | −1.62 |
|  | EM4 | −6.00 | −3.01 | −5.19 | −1.66 |
|  | EM5 | −6.03 | −3.06 | −5.12 | −1.64 |
|  | EM7 | −6.01 | −3.13 | −5.02 | −1.70 |
|  | EM10 | −6.31 | −2.83 | −5.67 | −1.21 |
|  | EM13 | −5.99 | −3.06 | −5.13 | −1.46 |
|  | EM17 | −5.73 | −3.53 | −4.68 | −2.07 |
|  | EM22 | −5.80 | −3.20 | −4.94 | −1.77 |
|  | EM27 | −6.22 | −3.11 | −5.73 | −1.87 |
| Red dopant | RD2 | −5.40 | −3.30 | −4.65 | −2.30 |
|  | RD5 | −5.62 | −3.63 | −4.72 | −2.37 |
|  | RD10 | −5.60 | −3.55 | −4.98 | −2.58 |
|  | RD15 | −5.55 | −3.50 | −4.63 | −2.34 |
|  | RD21 | −5.65 | −3.61 | −4.87 | −2.52 |
| Blue dopant | BD1 | −5.46 | −2.67 | −4.73 | −1.47 |
|  | BD4 | −5.56 | −2.77 | −5.08 | −1.49 |
|  | BD8 | −6.05 | −3.26 | −5.18 | −1.72 |
|  | BD9 | −6.08 | −3.38 | −5.24 | −1.84 |
|  | BD15 | −6.10 | −3.40 | −5.20 | −1.91 |
|  | BD19 | −6.11 | −3.48 | −5.49 | −2.21 |
|  | BD20 | −5.90 | −3.30 | −5.04 | −1.82 |
|  | BD23 | −6.20 | −3.52 | −5.44 | −2.06 |
|  | BD24 | −6.08 | −3.38 | −5.32 | −1.94 |
|  | BD25 | −6.10 | −3.40 | −5.02 | −1.91 |
| Green dopant | GD3 | −5.40 | −2.60 | −4.74 | −1.83 |
|  | GD4 | −5.58 | −3.03 | −4.70 | −1.85 |
|  | GD7 | −5.77 | −3.57 | −5.00 | −1.97 |

TABLE 2-continued

|  | Compound | HOMO (eV) Measured value | LUMO (eV) Measured value | HOMO (eV) Calculated value | LUMO (eV) Calculated value |
|---|---|---|---|---|---|
|  | GD9 | −5.94 | −3.45 | −5.02 | −1.96 |
|  | GD10 | −5.87 | −3.49 | −5.01 | −1.98 |
|  | GD11 | −5.82 | −3.51 | −5.00 | −1.97 |
|  | GD22 | −5.90 | −3.40 | −5.02 | −2.06 |
|  | GD27 | −5.84 | −3.52 | −4.95 | −2.08 |

Examples 1 to 2 and Comparative Examples 1 to 4

An ITO film was formed on a glass substrate and subjected to desired patterning to form an ITO electrode (anode). The thickness of the ITO electrode was 100 nm. Subsequently, the cleaned substrate having the electrode formed thereon and materials were placed in a vacuum deposition apparatus (manufactured by ULVAC). The apparatus was evacuated to $1.3 \times 10^{-4}$ Pa ($1 \times 10^{-6}$ Torr) or less, and UV/ozone cleaning was then performed. Thereafter, vacuum deposition was performed by resistance heating to form layers configured as shown in Table 3. The thickness d (HBL) of the hole-blocking layer and the thickness d (ETL) of the electron transport layer were as shown in Table 4. The electrode area of the opposite electrodes (the anode and the cathode) was 3 mm$^2$. The substrate was then transferred to a nitrogen atmosphere glove box. The glove box was sealed with a glass cap with a desiccant to obtain a white organic EL element.

The white organic EL element obtained was connected to a voltage application device and evaluated for the following properties. The results are shown in Table 4. The elements fabricated all exhibited good white-light emission.

Drive Voltage

The voltage at 100 mA/cm$^2$ was measured to evaluate drive voltage. A 4140B microammeter manufactured by Hewlett-Packard Company was used for the measurement.

Decrease in Luminance

A continuous operation test was performed at an initial luminance of 2000 cd/m$^2$, and the decrease in luminance after 100 hours was determined. The emission luminance was measured with a BM7 manufactured by TOPCON Corporation. The measurement was performed from the side sealed with the glass cap.

TABLE 3

|  |  | Material |  | Thickness (nm) |
|---|---|---|---|---|
| Cathode |  | Mg | Mass ratio Mg:Ag = 50:50 | 10 |
|  |  | Ag |  |  |
| Electron injection layer |  | LiF |  | 1.5 |
| Electron transport layer |  | ET2 |  | d (ETL) |
| Hole-blocking layer |  | HB4 |  | d (HBL) |
| First light-emitting layer | First host | EM4 | Mass ratio EM4:BD8 = 99.0:1.0 | 10 |
|  | First dopant (Blue dopant) | BD8 |  |  |
| Second light-emitting layer | Second host | EM1 | Mass ratio EM1:GD22 = 99.0:1.0 | 5 |
|  | Second dopant (Green dopant) | GD22 |  |  |
| Third light-emitting layer | Third host | EM1 | Mass ratio EM1:RD5 = 99.5:0.5 | 5 |
|  | Third dopant (Red dopant) | RD5 |  |  |
| Electron-blocking layer |  | HT7 |  | 10 |
| Hole transport layer |  | HT2 |  | 5 |
| Hole injection layer |  | HT16 |  | 5 |

TABLE 4

|  | d (HBL) [nm] | d (ETL) [nm] | d (ETL)/ d (HBL) | d (E) [nm] | d (E)/ d (H) | Drive voltage [V] | Decrease in luminance [%] |
| --- | --- | --- | --- | --- | --- | --- | --- |
| Example 1 | 80 | 10 | 0.13 | 90 | 4.50 | 4.6 | 10 |
| Example 2 | 100 | 10 | 0.10 | 110 | 5.50 | 4.8 | 10 |
| Comparative Example 1 | 10 | 60 | 6 | 70 | 3.50 | 5.9 | Short-circuited due to increased voltage |
| Comparative Example 2 | 10 | 80 | 8 | 90 | 4.50 | 7.0 | Short-circuited due to increased voltage |
| Comparative Example 3 | 10 | 100 | 10 | 110 | 5.50 | 8.0 | Short-circuited due to increased voltage |
| Comparative Example 4 | 20 | 10 | 0.5 | 30 | 1.5 |  | Unmeasurable due to increased current leakage |

As in Examples 1 and 2, the organic EL elements of the present disclosure have low drive voltages, exhibit a small decrease in luminance, and have high durability. By contrast, as in Comparative Examples 1 to 3, when the value of d (ETL)/d (HBL) is large, that is, the hole-blocking layer is relatively thin, the drive voltage is high. In particular, in Comparative Examples 2 and 3, the drive voltage is high despite that the values of d (E), the electron supply layer total thickness, are equal to those of Examples 1 and 2, respectively. In Comparative Examples 1 to 3, an excessive increase in voltage occurred during the continuous operation test, and the 100-hour durability measurement could not be performed. As in Comparative Example 4, when d (E) was thin, a leak current was observed, and the current-voltage properties could not be determined. This is probably due to the small thickness of the entire element and hence due to the influence of, for example, foreign matter on the substrate or metal pieces attached during the metal electrode deposition.

Examples 3 to 11 and Comparative Examples 5 to 13

A Ti film 40 nm thick was formed on a glass substrate by sputtering and patterned by photolithography to form an anode. Subsequently, in the same manner as in Example 1, layers were formed with the layer structure (d (HBL) and d (ETL) are thicknesses shown in Table 6) shown in Table 5. Thereafter, a white organic EL element was obtained in the same manner as in Example 1. The white organic EL element obtained was evaluated for the following properties in addition to the properties evaluated in Example 1. The results are shown in Table 6.

Chromaticity

The chromaticity during a low-current operation at a current density of 1.0 mA/cm$^2$ was measured using an "SR-3" manufactured by TOPCON Corporation.

TABLE 5

|  | Material |  | Thickness (nm) |
| --- | --- | --- | --- |
| Cathode | Mg Ag | Mass ratio Mg:Ag = 50:50 | 15 |
| Electron injection layer | LiF |  | 1.5 |
| Electron transport layer | ET5 |  | d (ETL) |
| Hole-blocking layer | HB8 |  | d (HBL) |
| First light-emitting layer | First host EM1 | Mass ratio | 10 |
|  | First dopant (Blue dopant) BD24 | EM1:BD24 = 99.4:0.6 |  |
| Second light-emitting layer | Second host EM1 | Mass ratio | 20 |
|  | Third dopant (Red dopant) RD5 | EM1:RD5:GD27 = 96.5:0.5:3.0 |  |
|  | Second dopant (Green dopant) GD27 |  |  |
| Electron-blocking layer | HT12 |  | 10 |
| Hole transport layer | HT1 |  | 10 |
| Hole injection layer | HT16 |  | 5 |

TABLE 6

|  | d (HBL) [nm] | d (ETL) [nm] | d (ETL)/ d (HBL) | d (E) [nm] | d (E)/ d (H) | Drive voltage [V] | Decrease in luminance [%] | Chromaticity |
| --- | --- | --- | --- | --- | --- | --- | --- | --- |
| Comparative Example 5 | 40 | 20 | 0.50 | 60 | 2.4 | 4.2 | 6 | (0.46, 0.38) |
| Comparative Example 6 | 60 | 20 | 0.33 | 80 | 3.2 | 4.5 | 8 | (0.41, 0.35) |
| Example 3 | 80 | 20 | 0.25 | 100 | 4.0 | 4.9 | 6 | (0.32, 0.30) |
| Example 4 | 100 | 20 | 0.20 | 120 | 4.8 | 5.2 | 6 | (0.29, 0.31) |

TABLE 6-continued

|  | d (HBL) [nm] | d (ETL) [nm] | d (ETL)/ d (HBL) | d (E) [nm] | d (E)/ d (H) | Drive voltage [V] | Decrease in luminance [%] | Chromaticity |
|---|---|---|---|---|---|---|---|---|
| Example 5 | 120 | 20 | 0.17 | 140 | 5.6 | 5.4 | 7 | (0.35, 0.39) |
| Comparative Example 7 | 140 | 20 | 0.14 | 160 | 6.4 | 5.8 | 10 | (0.43, 0.43) |
| Comparative Example 8 | 40 | 30 | 0.75 | 70 | 2.8 | 4.8 | 6 | (0.43, 0.35) |
| Example 6 | 60 | 30 | 0.50 | 90 | 3.6 | 5 | 6 | (0.37, 0.34) |
| Example 7 | 80 | 30 | 0.38 | 110 | 4.4 | 5.2 | 5 | (0.30, 0.29) |
| Example 8 | 100 | 30 | 0.30 | 130 | 5.2 | 5.6 | 5 | (0.32, 0.36) |
| Comparative Example 9 | 120 | 30 | 0.25 | 150 | 6.0 | 5.9 | 6 | (0.37, 0.43) |
| Comparative Example 10 | 140 | 30 | 0.21 | 170 | 6.8 | 6.2 | 8 | (0.43, 0.43) |
| Comparative Example 11 | 40 | 40 | 1.00 | 80 | 3.2 | 5.1 | 7 | (0.41, 0.35) |
| Example 9 | 60 | 40 | 0.67 | 100 | 4.0 | 5.5 | 7 | (0.31, 0.30) |
| Example 10 | 80 | 40 | 0.50 | 120 | 4.8 | 5.7 | 5 | (0.28, 0.29) |
| Example 11 | 100 | 40 | 0.40 | 140 | 5.6 | 6 | 5 | (0.33, 0.39) |
| Comparative Example 12 | 120 | 40 | 0.33 | 160 | 6.4 | 6.5 | 8 | (0.41, 0.45) |
| Comparative Example 13 | 140 | 40 | 0.29 | 180 | 7.2 | 6.8 | 8 | (0.45, 0.41) |

As in Examples 3 to 11, the organic EL elements of the present disclosure have low drive voltages, exhibit small decreases in luminance, and have high durability. In addition, good white-light emission was achieved also in the low-current range. By contrast, when 90 nm≤d (E)<150 nm was not satisfied as in Comparative Examples 5 to 13, white-light emission could not be achieved.

Examples 12 to 17 and Comparative Examples 14 to 17

White organic EL elements were fabricated in the same manner as in Example 3 except that the materials of the light-emitting layers were replaced with compounds shown in Table 7, the material of the hole-blocking layer was replaced with HB6, and the thickness of the hole-blocking layer was changed to the thicknesses shown in Table 8. In Comparative Examples 15 to 17, the thicknesses of the third light-emitting layer, the second light-emitting layer, and the first light-emitting layer were all 10 nm so that the total thickness of the light-emitting layers was the same as in Examples 12 to 17. The concentration ratio in each light-emitting layer in Comparative Examples 15 to 17 was host:dopant=99.5:0.5 by mass.

The organic EL elements obtained were evaluated in the same manner as in Example 1. The results are shown in Table 8. The elements fabricated all exhibited good white-light emission.

TABLE 7

| | Third light-emitting layer | | Second light-emitting layer | | | First light-emitting layer | |
|---|---|---|---|---|---|---|---|
| | Third host (H3) | Third dopant (D3) | Second host (H2) | Second dopant (D2) | Third dopant (D3) | First host (H1) | First dopant (H1) |
| | HOMO [eV]   LUMO [eV] | HOMO [eV]   LUMO [eV] | HOMO [eV]   LUMO [eV] | HOMO [eV]   LUMO [eV] | HOMO [eV]   LUMO [eV] | HOMO [eV]   LUMO [eV] | HOMO [eV]   LUMO [eV] |
| Example 12 | None | | EM1 −5.11  −1.67 | RD5 −4.72  −2.37 | GD10 −5.01  −1.98 | EM1 −5.11  −1.67 | BD9 −5.24  −1.84 |
| Example 13 | None | | EM1 −5.11  −1.67 | RD5 −4.72  −2.37 | GD10 −5.01  −1.98 | EM1 −5.11  −1.67 | BD9 −5.24  −1.84 |
| Example 14 | None | | EM4 −5.19  −1.66 | RD5 −4.72  −2.37 | GD10 −5.01  −1.98 | EM1 −5.11  −1.67 | BD9 −5.24  −1.84 |
| Example 15 | None | | EM4 −5.19  −1.66 | RD10 −4.98  −2.58 | GD22 −5.02  −2.06 | EM1 −5.11  −1.67 | BD24 −5.32  −1.94 |
| Example 16 | None | | EM1 −5.11  −1.67 | RD21 −4.81  −2.47 | GD10 −5.01  −1.98 | EM5 −5.12  −1.64 | BD24 −5.32  −1.94 |
| Example 17 | None | | EM4 −5.19  −1.66 | RD21 −4.81  −2.47 | GD10 −5.01  −1.98 | EM1 −5.11  −1.67 | BD24 −5.32  −1.94 |
| Comparative Example 14 | None | | EM1 −5.11  −1.67 | RD5 −4.72  −2.37 | GD10 −5.01  −1.98 | EM1 −5.11  −1.67 | BD1 −4.73  −1.47 |
| Comparative Example 15 | EM1 −5.11  −1.67 | RD10 −4.98  −2.58 | EM1 −5.11  −1.67 | BD9 −5.24  −1.84 | None | EM1 −5.11  −1.67 | GD10 −5.01  −1.98 |
| Comparative Example 16 | EM1 −5.11  −1.67 | RD10 −4.98  −2.58 | EM1 −5.11  −1.67 | BD9 −5.24  −1.84 | None | EM1 −5.11  −1.67 | GD10 −5.01  −1.98 |
| Comparative Example 17 | EM4 −5.19  −1.66 | RD5 −4.72  −2.37 | EM4 −5.19  −1.66 | BD9 −5.24  −1.84 | None | EM1 −5.11  −1.67 | GD10 −5.01  −1.98 |

TABLE 8

| Example | d (HBL) [nm] | d (ETL) [nm] | d (ETL)/ d (HBL) | d (E) [nm] | d (E)/ d (H) | Drive voltage [V] | Decrease in luminance [%] |
|---|---|---|---|---|---|---|---|
| Example 12 | 85 | 20 | 0.24 | 105 | 4.20 | 5.6 | 8 |
| Example 13 | 90 | 20 | 0.22 | 110 | 4.40 | 5.9 | 8 |
| Example 14 | 95 | 20 | 0.21 | 115 | 4.60 | 6.0 | 7 |
| Example 15 | 95 | 20 | 0.21 | 115 | 4.60 | 5.9 | 4 |
| Example 16 | 95 | 20 | 0.21 | 115 | 4.60 | 6.0 | 5 |
| Example 17 | 95 | 20 | 0.21 | 115 | 4.60 | 6.0 | 5 |
| Comparative Example 14 | 90 | 20 | 0.22 | 110 | 4.40 | 5.9 | 20 |
| Comparative Example 15 | 80 | 20 | 0.25 | 100 | 4.00 | 5.8 | 15 |
| Comparative Example 16 | 85 | 20 | 0.24 | 105 | 4.20 | 5.9 | 10 |
| Comparative Example 17 | 95 | 20 | 0.21 | 115 | 4.60 | 6.0 | 10 |

As in Examples 12 to 17, the white organic EL elements of the present disclosure have low drive voltages and high durability, whereas as in Comparative Example 14, the durability was low when the first light-emitting layer did not have electron-trapping properties. As in Comparative Examples 15 to 17, the durability was low also when the blue-light-emitting layer was not adjacent to the hole-blocking layer.

The present disclosure provides a white organic EL element having improved durability and a low drive voltage.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-145705 filed Aug. 2, 2018, which is hereby incorporated by reference herein in its entirety.

What is claimed is:

1. A white organic electroluminescent (EL) element comprising, in sequence:
   an anode;
   a first light-emitting layer that is a blue-light-emitting layer;
   a hole-blocking layer;
   an electron transport layer; and
   a cathode,
   wherein the hole-blocking layer is adjacent to the first light-emitting layer and the electron transport layer,
   the first light-emitting layer contains a first host and a first dopant that emits blue fluorescent light,
   the hole-blocking layer is formed of a hydrocarbon,
   the electron transport layer is formed of a nitrogen-containing heterocyclic compound,
   the first host and the first dopant satisfy relation (a), and the hole-blocking layer and the electron transport layer satisfy relation (b) and relation (c):

$$\text{LUMO}(H1) > \text{LUMO}(D1) \quad (a)$$

$$0.1 < d(\text{ETL})/d(\text{HBL}) < 0.7 \quad (b)$$

$$90 \text{ nm} \le d(E) = d(\text{HBL}) + d(\text{ETL}) < 150 \text{ nm}, \quad (c)$$

where LUMO (H1) is a lowest unoccupied molecular orbital (LUMO) energy of the first host,
   LUMO (D1) is a LUMO energy of the first dopant,
   d (HBL) is a thickness of the hole-blocking layer,
   d (ETL) is a thickness of the electron transport layer, and
   d (E) is a total thickness of an electron supply layer composed of the hole-blocking layer and the electron transport layer.

2. The white organic EL element according to claim 1, wherein the hole-blocking layer is formed of an aromatic hydrocarbon, and the aromatic hydrocarbon has a molecular structure constituted by an aromatic hydrocarbon ring selected from the group consisting of a benzene ring, a naphthalene ring, a fluorene ring, a benzofluorene ring, a phenanthrene ring, a chrysene ring, and a triphenylene ring, and optionally has an alkyl group having 1 to 12 carbon atoms.

3. The white organic EL element according to claim 1, further comprising, between the anode and the first light-emitting layer, a hole supply layer including a hole transport layer, wherein the hole supply layer and the electron supply layer satisfy relation (d):

$$2.0 < d(E)/d(H) < 6.0 \quad (d)$$

where d (E) is a total thickness of the electron supply layer, and
d (H) is a total thickness of the hole supply layer.

4. The white organic EL element according to claim 1, further comprising, between the anode and the first light-emitting layer, a second light-emitting layer and a third light-emitting layer,
   wherein the second light-emitting layer contains a second host and a second dopant that emits fluorescent light,
   the third light-emitting layer contains a third host and a third dopant that emits fluorescent light,
   the second host and the second dopant satisfy relation (e), and the third host and the third dopant satisfy relation (f):

$$\text{LUMO}(H2) > \text{LUMO}(D2) \quad (e)$$

$$\text{LUMO}(H3) > \text{LUMO}(D3) \quad (f)$$

where LUMO (H2) is a LUMO energy of the second host, LUMO (D2) is a LUMO energy of the second dopant, LUMO (H3) is a LUMO energy of the third host, and LUMO (D3) is a LUMO energy of the third dopant.

5. The white organic EL element according to claim 4, wherein the first host, the second host, or the third host is a hydrocarbon.

6. The white organic EL element according to claim 4, wherein the first dopant, the second dopant, or the third dopant is a compound having a fluoranthene skeleton.

7. The white organic EL element according to claim 1, further comprising a second light-emitting layer between the anode and the first light-emitting layer,
wherein the second light-emitting layer contains a second host, a second dopant that emits fluorescent light, and a third dopant that emits fluorescent light,
the second host and the second dopant satisfy relation (g), and the second host and the third dopant satisfy relation (h):

$$\mathrm{LUMO}(H2) > \mathrm{LUMO}(D2) \tag{g}$$

$$\mathrm{LUMO}(H2) > \mathrm{LUMO}(D3) \tag{h}$$

where LUMO (H2) is a LUMO energy of the second host, LUMO (D2) is a LUMO energy of the second dopant, and LUMO (D3) is a LUMO energy of the third dopant.

8. The white organic EL element according to claim 7, wherein the first host or the second host is a hydrocarbon.

9. The white organic EL element according to claim 1, further comprising an electron injection layer between the cathode and the electron transport layer.

10. The white organic EL element according to claim 9, wherein the electron injection layer contains an alkali metal or an alkaline earth metal.

11. A display device comprising a plurality of pixels, wherein at least one of the pixels includes the white organic EL element according to claim 1 and an active element connected to the white organic EL element.

12. An image capture apparatus comprising:
an optical unit including a plurality of lenses;
an image capture element configured to receive light that has passed through the optical unit; and
a display unit,
wherein the display unit is configured to display information acquired by the image capture element and includes the display device according to claim 11.

13. An electronic device comprising:
a housing;
a communication unit configured to communicate with an external device; and
a display unit,
wherein the display unit is the display device according to claim 11.

14. A lighting device comprising:
a light source; and
a light diffusion unit or an optical filter,
wherein the light source includes the white organic EL element according to claim 1.

15. A moving object comprising:
a body; and
a lighting fixture mounted to the body,
wherein the lighting fixture includes the white organic EL element according to claim 1.

* * * * *